United States Patent
Oh et al.

(10) Patent No.: US 8,841,643 B2
(45) Date of Patent: Sep. 23, 2014

(54) SEMICONDUCTOR MEMORY DEVICE INCLUDING BUFFER ELECTRODE

(75) Inventors: Gyu-Hwan Oh, Hwaseong-si (KR);
Shin-Jae Kang, Yongin-si (KR);
Sug-Woo Jung, Hwaseong-si (KR);
Dong-Hyun Im, Hwaseong-si (KR);
Chan-Mi Lee, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 405 days.

(21) Appl. No.: 13/241,506

(22) Filed: Sep. 23, 2011

(65) Prior Publication Data
US 2012/0119181 A1 May 17, 2012

(30) Foreign Application Priority Data
Nov. 16, 2010 (KR) .................. 10-2010-0113855

(51) Int. Cl.
*H01L 45/00* (2006.01)
*H01L 27/24* (2006.01)
*H01L 27/22* (2006.01)

(52) U.S. Cl.
CPC ............ *H01L 45/06* (2013.01); *H01L 27/2409* (2013.01); *H01L 45/144* (2013.01); *H01L 45/126* (2013.01); *H01L 27/2472* (2013.01); *H01L 45/143* (2013.01); *H01L 45/04* (2013.01); *H01L 45/141* (2013.01); *H01L 45/146* (2013.01); *H01L 45/1233* (2013.01); *H01L 27/224* (2013.01)

USPC .................. 257/3; 257/4; 257/E45.002

(58) Field of Classification Search
CPC ............ H01L 45/06; H01L 45/1233
USPC .......................... 257/3, 4, E45.002
See application file for complete search history.

(56) References Cited

U.S. PATENT DOCUMENTS

| 8,288,752 | B2 * | 10/2012 | Park ................... 257/5 |
| 2003/0193063 | A1 | 10/2003 | Chiang et al. |
| 2008/0315172 | A1 * | 12/2008 | Happ et al. ............ 257/4 |
| 2011/0266518 | A1 * | 11/2011 | Kim ................... 257/13 |
| 2013/0234100 | A1 * | 9/2013 | An et al. ............. 257/4 |

FOREIGN PATENT DOCUMENTS

| KR | 1020060017737 | 2/2006 |
| KR | 1020090103564 | 10/2009 |
| KR | 1020100086852 | 8/2010 |

* cited by examiner

*Primary Examiner* — Jerome Jackson, Jr.
*Assistant Examiner* — Paul Budd
(74) *Attorney, Agent, or Firm* — F. Chau & Associates, LLC

(57) ABSTRACT

A semiconductor device includes a switching device disposed on a substrate. A buffer electrode pattern is disposed on the switching device. The buffer electrode pattern includes a first region having a first vertical thickness, and a second region having a second vertical thickness smaller than the first vertical thickness. A lower electrode pattern is disposed on the first region of the buffer electrode pattern. A trim insulating pattern is disposed on the second region of the buffer electrode pattern. A variable resistive pattern is disposed on the lower electrode pattern.

20 Claims, 28 Drawing Sheets

(a)  (b)

SEMICONDUCTOR MEMORY DEVICE INCLUDING BUFFER ELECTRODE

CROSS-REFERENCE TO RELATED APPLICATION

This application claims priority under 35 U.S.C. §119 to Korean Patent Application No. 10-2010-0113855 filed on Nov. 16, 2010, the disclosure of which is hereby incorporated by reference in its entirety.

BACKGROUND

1. Technical Field

Exemplary embodiments of the inventive concept relate to a semiconductor device, a method of fabricating the same, and a memory system including the semiconductor device.

2. Description of Related Art

In general, to reduce the size of a variable resistive memory device and increase its performance, a variety of methods varying the size and shape of a lower electrode pattern have been researched.

SUMMARY

Exemplary embodiments of the inventive concept provide a semiconductor device including a buffer electrode.

Exemplary embodiments of the inventive concept provide a memory system including the semiconductor device.

Exemplary embodiments of the inventive concept provide various methods of fabricating the semiconductor device.

In accordance with an exemplary embodiment of the inventive concept, a semiconductor device includes a switching device disposed on a substrate, a buffer electrode pattern disposed on the switching device. The buffer electrode pattern including a first region having a first vertical thickness, and a second region having a second vertical thickness smaller than the first vertical thickness. The semiconductor device further includes a lower electrode pattern disposed on the first region of the buffer electrode pattern, a trim insulating pattern disposed on the second region of the buffer electrode pattern, and a variable resistive pattern disposed on the lower electrode pattern.

In accordance with an exemplary embodiment of the inventive concept, a semiconductor device includes a silicide pattern disposed on a diode, a buffer electrode pattern disposed on the silicide pattern, a lower electrode pattern disposed on the buffer electrode pattern and overlapping the buffer electrode pattern. The lower electrode pattern including a first pattern parallel to a substrate and a second pattern vertical to the substrate. The semiconductor device further includes a core insulating pattern disposed on the first pattern, and a trim insulating pattern disposed on the buffer electrode pattern.

In accordance with an exemplary embodiment of the inventive concept, a memory system includes a semiconductor memory device including a variable resistive memory device and a memory controller, a central processing unit (CPU), a user interface, and a power supply device. At least one of the variable resistive memory device and the memory controller includes a substrate including a word line, a first interlayer insulating layer disposed on the substrate. The first interlayer insulating layer including a first hole, a diode in contact with the word line in the first hole, a silicide pattern disposed on the diode in the first hole, a buffer electrode pattern disposed on the silicide pattern in the first hole; a lower electrode pattern disposed on the buffer electrode pattern in the first hole, and a trim insulating pattern disposed on the buffer electrode pattern in the first hole. A bottom surface level of the trim insulating pattern may be lower than a bottom surface level of the lower electrode pattern.

In accordance with an exemplary embodiment of the inventive concept, a method for fabricating a semiconductor device is provided. The method includes forming a conductive line in an active region of a substrate, forming a first interlayer insulating layer on the substrate, forming a first hole in the first interlayer insulating layer exposing the conductive line, forming a switching element in the first hole contacting a top surface of the conductive line, forming a silicide pattern in the first hole on the switching element, forming a buffer electrode pattern in the first hole on the silicide pattern, forming a lower electrode pattern in the first hole on the buffer electrode pattern and forming a core insulating pattern on the lower electrode pattern. The method further includes partially removing the core insulating pattern, the lower electrode pattern and the first interlayer insulating layer to form a trench which horizontally extends to the first interlayer insulating layer and vertically extends to an upper portion of the buffer electrode pattern, forming a trim insulating pattern in the trench to thereby overlap the buffer electrode pattern, forming a variable resistive pattern on the lower electrode pattern, forming an upper electrode pattern on the variable resist pattern; and forming an upper conductive line on the upper electrode pattern.

BRIEF DESCRIPTION OF THE DRAWINGS

Exemplary embodiments of the inventive concepts can be understood in more detail from the following detailed description taken in conjunction with the accompanying drawings in which like reference characters refer to the same parts throughout the different views. The drawings are not necessarily to scale. In the drawings.

DETAILED DESCRIPTION OF EXEMPLARY EMBODIMENTS

Various embodiments will now be described more fully with reference to the accompanying drawings in which some embodiments are shown.

Figure 1:
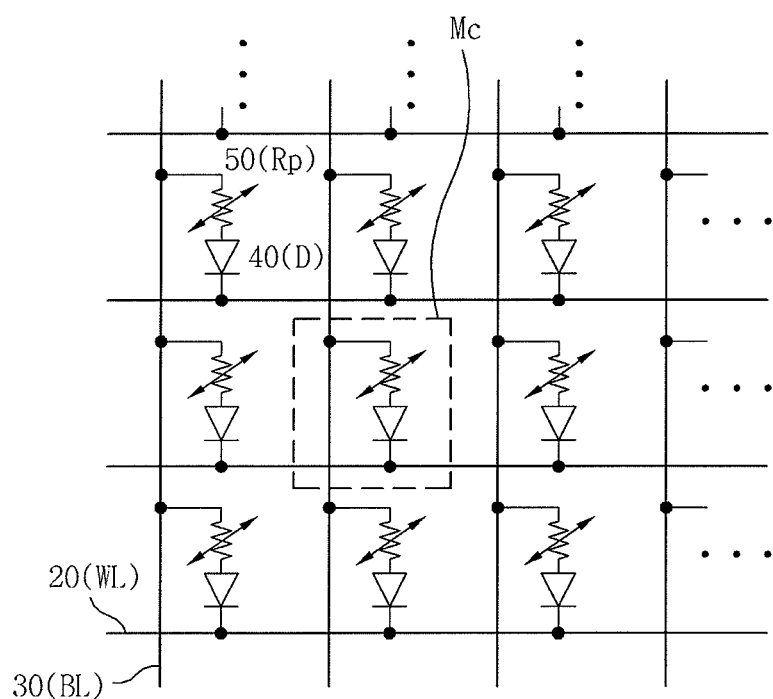
FIG. 1 is an equivalent circuit diagram of a semiconductor device according to an exemplary embodiment of the inventive concept.
Figure 2A:
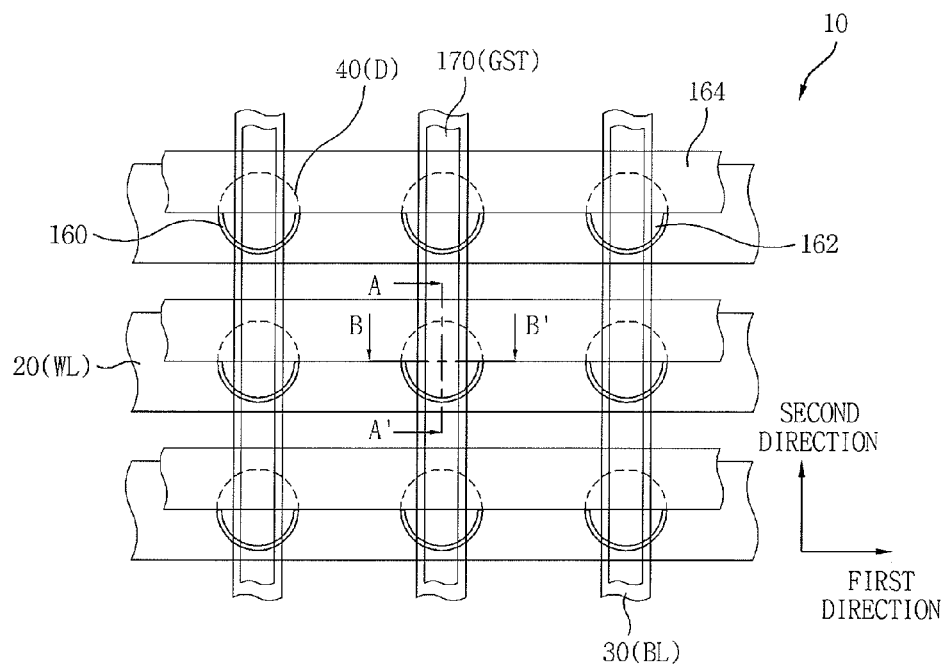
FIGS. 2A and 2B are a conceptual layout diagram and longitudinal sectional view of a semiconductor device according to an exemplary embodiment of the inventive concept, respectively.
Figure 2B:
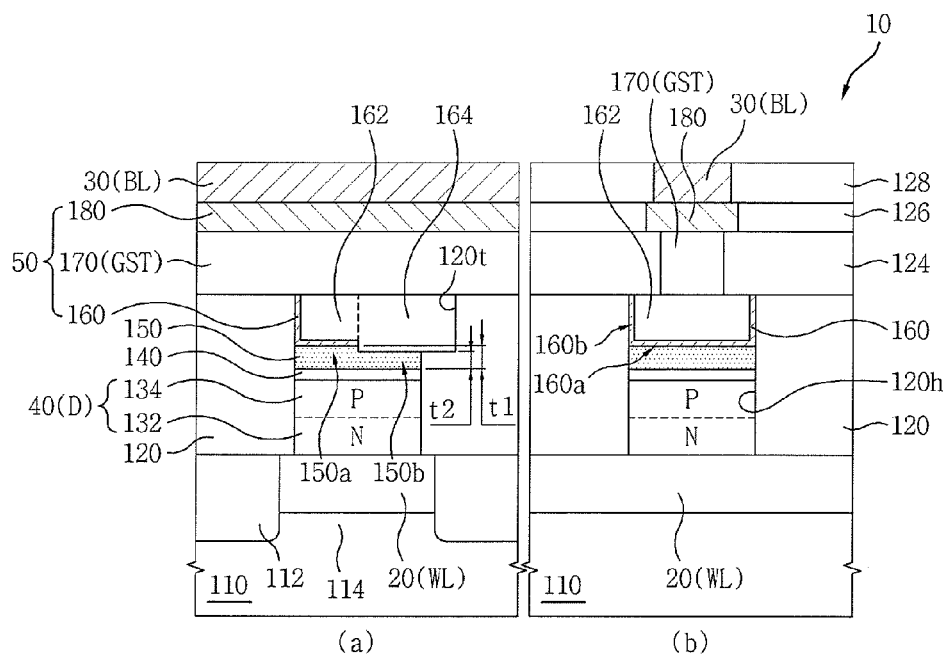

FIG. 1 is an equivalent circuit diagram of a semiconductor device according to an exemplary embodiment of the inventive concept, FIG. 2A is a plan view illustrating the layout of the semiconductor device shown in FIG. 1, and (a) and (b) of FIG. 2B are longitudinal sectional views taken along lines A-A' and B-B' of FIG. 2A, respectively.

Referring to FIGS. 1, 2A and 2B, a semiconductor device 10 according to an exemplary embodiment of the inventive concept may include, for example, a substrate 110, a lower conductive line 20 extending in a first direction of the substrate 110, an upper conductive line 30 extending in a second direction of the substrate 110, and a variable resistive device 50 connected to the lower conductive line 20 disposed below the variable resistive device 50 through a switching device 40 and connected to the upper conductive line 30 disposed on the variable resistive device 50. The first direction may be, for example, perpendicular to the second direction. One switching device 40 and one variable resistive device 50 may constitute a unit memory cell Mc. The switching device 40 and a portion of the variable resistive device 50 may be disposed within a first hole 120h and integrally confined by a first interlayer insulating layer 120. The first hole 120h may have, for example, a planar sectional structure with a circuit shape.

The semiconductor device 10 according to the current exemplary embodiment of the inventive concept may include a variable resistive memory device Rp, such as, for example, a phase-change random memory (PRAM), a resistive random access memory (RRAM), or a magnetic random access memory (MRAM), according to the kind of the variable resistive device 50 that constitutes the memory cell Mc. For example, when the variable resistive device 50 includes upper and lower electrodes and a phase-change material GST interposed therebetween and has a variable resistance according to a temperature, the semiconductor device 10 may be a PRAM. When the variable resistive device 50 includes upper and lower electrodes and has a transitional metal oxide interposed between, the semiconductor device 10 may become, for example, an RRAM. When the variable resistive device 50 includes upper and lower electrodes formed of magnetic materials and an insulating material interposed therebetween, the semiconductor device 10 may be, for example, an MRAM. Hereinafter, a case where the variable resistive device 50 is a phase-change material will be described as an example.

The substrate 110 may include, for example, a silicon (Si) substrate, a germanium (Ge) substrate, a Si—Ge substrate, a silicon-on-insulator (SOI) substrate, or a germanium-on-insulator (GOI) substrate.

The lower conductive line 20 may be included in an active region 114 defined by an isolation region 112 in the substrate 110. For example, the lower conductive line 20 may be formed by implanting impurity ions into the active region 114. When the substrate 110 has a p-type of conductivity, impurity ions, such as, for example, phosphorus (P) ions, arsenic (As) ions, or antimony (Sb) ions may be implanted into the active region 114 so that the lower conductive line 20 may have an n-type of conductivity. When the substrate 110 has an n-type of conductivity, impurity ions, such as, for example, boron (B) ions, gallium (Ga) ions, or indium (In) ions may be implanted into the active region 114 so that the lower conductive line 20 can have a p-type of conductivity. In another case, the lower conductive line 20 may include, for example, a metal material (e.g., a metal silicide or metal thin layer) disposed in an insulating material. The lower conductive line 20 may be interpreted as an interconnection line or word line WL connected to the variable resistive device 50 in the first direction of the substrate 110.

The switching device 40 may include, for example, a vertical cell diode D including a lower semiconductor pattern 132 and an upper semiconductor pattern 134 vertically stacked. The lower semiconductor pattern 132 may contact a top surface of the lower conductive line 20. The lower semiconductor pattern 132 may have the same type of conductivity as the lower conductive line 20. The upper semiconductor pattern 134 may have a different type of conductivity from the lower conductive line 20. For example, the lower semiconductor pattern 132 may include an n-type semiconductor region, while the upper semiconductor pattern 134 may include a p-type semiconductor region. The lower and upper semiconductor patterns 132 and 134 may be interpreted as the vertical cell diode D electrically connected to the lower conductive line 20. A top surface level of the vertical cell diode D may be, for example, lower than a top surface level of the first interlayer insulating layer 120. The vertical cell diode D may be disposed in a lower region of the first hole 120h. Alternatively, since the switching device 40 may function to select the variable resistive device 50, the switching device 40 may include a transistor Tr besides the diode D. For example, when the switching device 40 includes the diode D, the variable resistive device 50 and the word line WL may be respectively connected to both terminals of the diode D. Although not shown, when the switching device 40 includes the transistor Tr, the word line WL may be connected to a gate, and the variable resistive device 50 and a reference voltage may be respectively connected to a drain and a source. In the present embodiment, the vertical cell diode D may serve as the switching device 40, thereby increasing the integration density and reducing the resistance of the word line WL.

The semiconductor device 10 according to an exemplary embodiment of the inventive concept may include a silicide pattern 140 interposed between the switching device 40 and the variable resistive device 50. The silicide pattern 140 may be, for example, an ohmic contact layer obtained by annealing a metal layer. The ohmic contact layer may be formed on the vertical cell diode D, thereby reducing contact resistance between the switching device 40 and the variable resistive device 50 and facilitating the flow of current from the switching device 40 to the variable resistive device 50. The metal layer may include, for example, cobalt (Co), nickel (Ni), tungsten (W), or titanium (Ti). Accordingly, the silicide pattern 140 may include, for example, cobalt silicide ($CoSi_2$), nickel silicide ($NiSi_2$), tungsten silicide ($WSi_2$), or titanium silicide ($TiSi_2$).

The variable resistive device 50 may include, for example, a lower electrode pattern 160, a variable resistive pattern 170, and an upper electrode pattern 180. The variable resistive device 50 may serve a memory function between the lower and upper conductive lines 20 and 30.

The lower electrode pattern 160 may be used as, for example, a heating apparatus. That is, the lower electrode pattern 160 may function to vary the resistance of the variable resistive device 50. The lower electrode pattern 160 may have, for example, a ring-shaped plane sectional structure or a U-shaped longitudinal sectional structure. For example, in a PRAM semiconductor memory device, a reset current required to change a phase-change material GST from a crystalline state into an amorphous state may be inversely proportional to the contact area between the lower electrode pattern 160 and the variable resistive pattern 170. Accordingly, the contact area between the lower electrode pattern 160 and the variable resistive pattern 170 may be lessened to reduce the reset current. To this end, the lower electrode pattern 160 may have, for example, an arc-shaped plane sectional structure or an L-shaped longitudinal sectional structure. That is, the resistance of a lower region of the lower electrode pattern 160 may be reduced by maximizing the sectional area of the lower region of the lower electrode pattern 160 to maximize the amount of current flowing therethrough, while the resistance of an upper region of the lower electrode pattern 160 may be increased by minimizing the sectional area of the upper region of the lower electrode pattern 160 to increase a heating effect so that the upper region of the lower electrode pattern 160 can generate sufficient heat with a small current. Accordingly, since the lower electrode pattern 160 may have, for example, a top-open cylindrical or half-cylindrical 3-dimensional shape, the semiconductor device 10 may include a core insulating pattern 162 disposed on one lateral surface of or within the lower electrode pattern 160. Alternatively, the core insulating pattern 162 may be formed on the one lateral surface and a bottom surface of the lower electrode pattern 160. Alternatively, the core insulating pattern 162 may be surrounded with the bottom surface and the lateral surface of the lower electrode pattern 160.

In addition, the lower electrode pattern 160 may include a conductive material that is very slowly reactive with a phase-change material (e.g., germanium antimony tellurium (GST)). Simultaneously, since the lower electrode pattern 160 may contact the phase-change material (e.g., GST) and serve as a heater during the writing of data in the phase-change material (e.g., GST), the lower electrode pattern 160 may include a high-resistivity material having a high resistivity. The lower electrode pattern 160 may include, for example, metal elements, nitrides containing the metal elements, or oxynitrides containing the metal elements. The lower electrode pattern 160 may include, for example, a carbon (C) layer, a carbon nitride (CN) layer, a titanium nitride (TiN) layer, a titanium aluminum nitride (TiAlN) layer, a titanium silicon nitride (TiSiN) layer, a titanium carbon nitride (TiCN) layer, a tungsten nitride (WN) layer, a cobalt silicon nitride (CoSiN) layer, a tungsten silicon nitride (WSiN) layer, a tantalum nitride (TaN) layer, a tantalum carbon nitride (TaCN) layer, or a tantalum silicon nitride (TaSiN) layer. Among these, for example, one of a TiSiN layer, a TiCN layer, and a TiAlN layer obtained by mixing a TiN layer with Si, C, and aluminum (Al) may form a high-resistivity electrode capable of reducing a reset current.

The variable resistive pattern 170 may include, for example, a phase-change material GST. For example, since the phase-change material GST may include chalcogenide elements, such as an alloy of germanium (Ge), antimony (Sb), and tellurium (Te), the properties of the phase-change material GST may depend on a composition ratio thereof. Also, in addition to germanium antimony tellurium Ge—Sb—Te (GST), the variable resistive pattern 170 may include, for example, one of various kinds of phase-change materials, such as germanium-tellurium-arsenide (Ge—Te—As), tellurium (Ge—Te), antimony-tellurium (Sb—Te), selenium-tellurium-Tin (Se—Te—Sn), germanium-tellurium-selenium (Ge—Te—Se), antimony-selenium-bismuth (Sb—Se—Bi), germanium-bismuth-tellurium (Ge—Bi—Te), germanium-tellurium-titanium (Ge—Te—Ti), indium-selenium (In—Se), gallium-tellurium-selenium (Ga—Te—Se), or indium-antimony-tellurium (In—Sb—Te) according to the kinds of additives. Thus, the variable resistive pattern 170 may have, for example, a double structure formed of different kinds of phase-change materials. In addition to the phase-change material, the variable resistive pattern 170 may further contain, for example, doped C, nitrogen (N), silicon (Si), or oxygen (O). The variable resistive pattern 170 may be modified into various shapes including, for example, an island or line shape.

The semiconductor device 10 according to an exemplary embodiment of the inventive concept may include, for example, a buffer electrode pattern 150 interposed between the silicide pattern 140 and the lower electrode pattern 160. The buffer electrode pattern 150 may have an etch selectivity with respect to the lower electrode pattern 160. For instance, when the lower electrode pattern 160 is recessed using an etching process, the buffer electrode pattern 150 may not be recessed or may be recessed less than the lower electrode pattern 160 and function as an etch stopper. For example, since the buffer electrode pattern 150 is formed between the silicide pattern 140 and the lower electrode pattern 160, the buffer electrode pattern 150 may prevent etching damage to the silicide pattern 140 (e.g., the ohmic contact layer) due to overetching during the trim process for partially removing the lower electrode pattern 160. When the ohmic contact layer is damaged due to overetching, current may not be transmitted from the switching device 40 to the variable resistive device 50. Also, by interposing the buffer electrode pattern 150 between the silicide pattern 140 and the lower electrode pattern 160, the height of the lower electrode pattern 160 may be controlled. For example, when the height of the lower electrode pattern 160 is lowered, a line resistance, that is, dynamic resistance, may be reduced.

The buffer electrode pattern 150 may include, for example, a metal layer and/or a metal nitride layer. The metal layer and/or the metal nitride layer may include single or multiple layers formed of, for example, Ti, TiN, Ta, TaN, W, WN, Ni, or NiN. For example, when the silicide pattern 140 includes cobalt silicide (CoSi$_2$) to increase ohmic contact efficiency, and the lower electrode pattern 160 includes a TiSiN layer, a TiCN layer, or a TiAlN layer to increase resistivity, contact resistance between the silicide pattern 140 and the lower electrode pattern 160 may be increased due to a mixture containing Si, C, or Al. In this case, since the buffer electrode pattern 150 may include, for example, Ti, TiN, Ta, TaN, W, WN, Ni, or NiN, contact resistance between the silicide pattern 140 and the lower electrode pattern 160 may be reduced.

The semiconductor device 10 according to exemplary embodiments of the inventive concept may include a trench 120t formed in the first interlayer insulating layer 120 and a trim insulating pattern 164 formed in the trench 120t. The trench 120t may horizontally extend to the first interlayer insulating layer 120 and vertically extend to an upper portion of the buffer electrode pattern 150. Due to the trim insulating pattern 164, one side of a top surface of the lower electrode pattern 160 may contact the variable resistive pattern 170, while the other side thereof may be cut off from the variable resistive pattern 170 so that the lower electrode pattern 160 may have an asymmetrical L-shaped longitudinal sectional structure. Thus, the lower electrode pattern 160 may have, for example, a U-shaped longitudinal sectional structure due to the core insulating pattern 162 and have an L-shaped longitudinal sectional structure due to the trim insulating pattern 164 so that the contact area between the lower electrode pattern 160 and the variable resistive pattern 170 can be reduced by as much, and contact resistance between the lower electrode pattern 160 and the variable resistive pattern 170 can be increased in proportion to the contact area. Thus, even a small current may concentrate on a small area to sufficiently heat the variable resistive pattern 170.

For example, the lower electrode pattern 160 may include a first pattern 160a configured to contact the buffer electrode pattern 150 and extend in a direction parallel to the substrate 110, and a second pattern 160b configured to contact the variable resistive pattern 170 and extend in a direction vertical to the substrate 110. The first pattern 160a may, for example, wholly or partially overlap the buffer electrode pattern 150 in a parallel direction. Top surfaces of the core insulating pattern 162 and the trim insulating pattern 164 may be, for example, at the same level from the substrate 110. In comparison, a bottom surface of the trim insulating pattern 164 may be, for example, at a lower level from the substrate 110 than a bottom surface of the core insulating pattern 162. A bottom surface level of the trim insulating pattern 164 may be, for example, lower than a bottom surface level of the lower electrode pattern 160. Accordingly, the buffer electrode pattern 150 may include, for example, a first region 150*a* disposed under the lower electrode pattern 160 and having a first thickness t1, and a second region 150*b* disposed under the trim insulating pattern 164 and having a second thickness t2 smaller than the first thickness t1. The first and second thicknesses t1 and t2 refer to vertical thicknesses. The buffer electrode pattern 150 may have a stepwise structure due to the first and second regions 150*a* and 150*b* with different thicknesses. The first region 150*a* may have, for example, the same sectional area as the second region 150*b*.

The upper electrode pattern 180 may include the same material as the lower electrode pattern 160. The upper electrode pattern 180 may include, for example, metal elements, nitrides containing the metal elements, or oxynitrides containing the metal elements. For example, the upper electrode pattern 180 may include C, CN, TiN, TiAlN, TiSiN, TiCN, WN, CoSiN, WSiN, TaN, TaCN, or TaSiN.

The upper conductive line 30 may include a conductive material, such as, for example, Ti, W, Si, copper (Cu), Ta, molybdenum (Mo), ruthenium (Ru), Al, gold (Au), platinum (Pt), silver (Ag), or an alloy containing at least one thereof. The upper conductive line 30 may intersect the lower conductive line 20. The upper conductive line 30 may be interpreted as a bit line BL. For example, as shown in FIG. 2B, the variable resistive pattern 170, the upper electrode pattern 180 and the upper conductive line 30 may be disposed in a second interlayer insulating layer 124, a third interlayer insulating layer 126 and a fourth interlayer insulating layer 128, respectively.

Figure 3A:
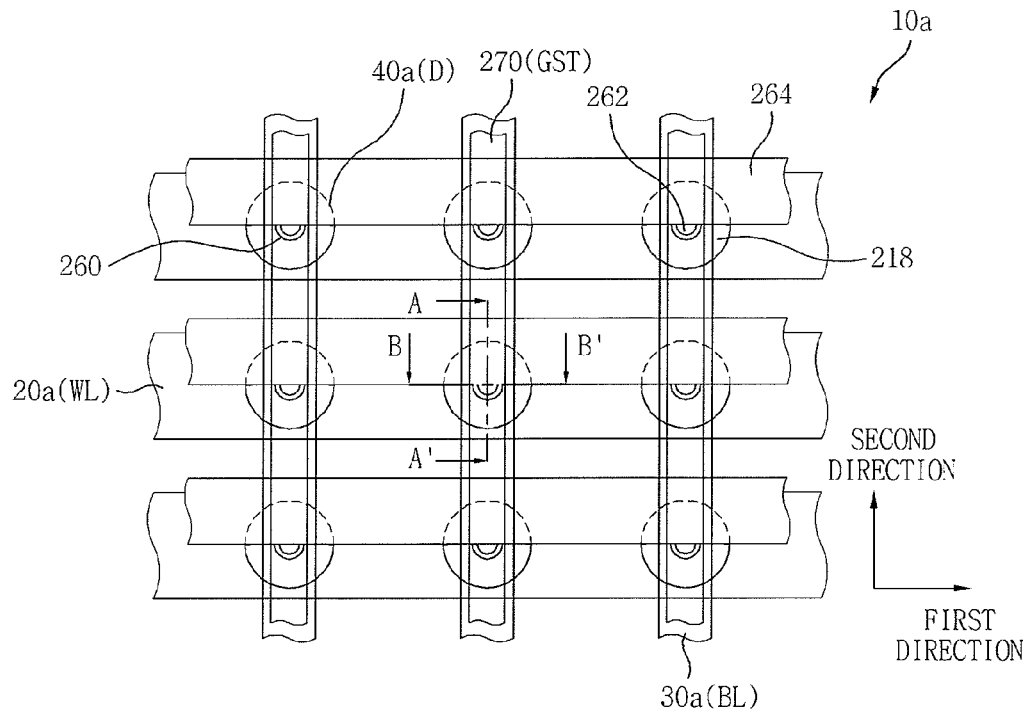
FIGS. 3A and 3B are a conceptual layout diagram and longitudinal sectional view of a semiconductor device according to an exemplary embodiment of the inventive concept, respectively.
Figure 3B:
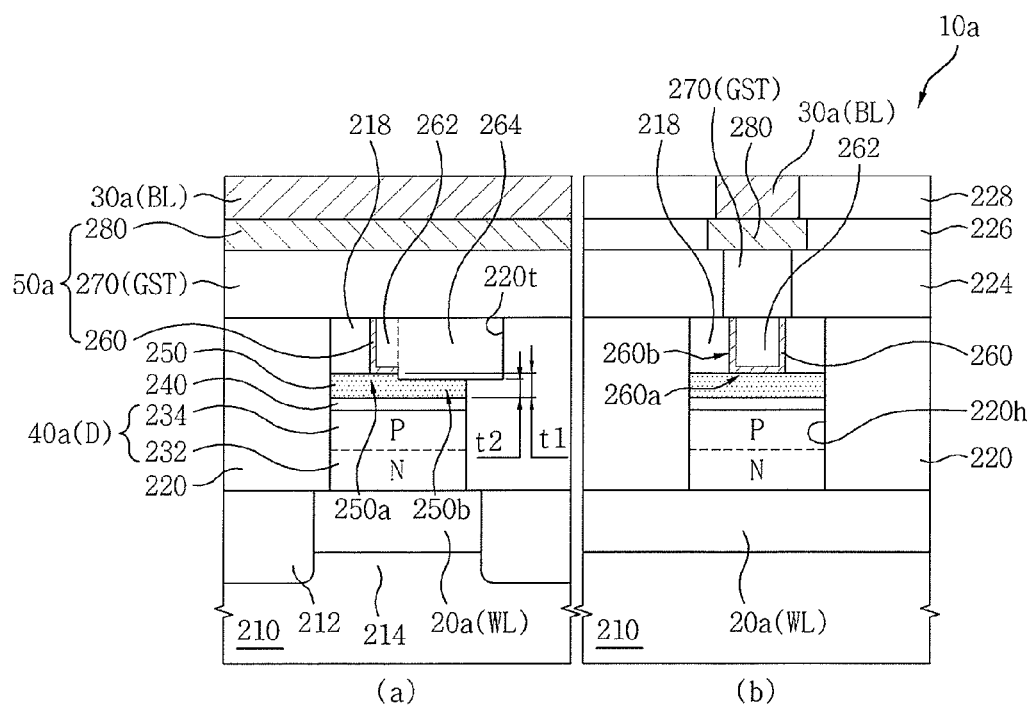

FIG. 3A is a plan view illustrating the layout of a semiconductor device according to an exemplary embodiment of the inventive concept, and (a) and (b) of FIG. 3B are schematic longitudinal sectional views taken along lines A-A' and B-B' of FIG. 3A, respectively.

Referring to FIGS. 3A and 3B, a semiconductor device 10*a* according to the current exemplary embodiment of the inventive concept may include, for example, a substrate 210, a lower conductive line 20*a*, an upper conductive line 30*a*, a switching device 40*a*, and a variable resistive device 50*a*. One switching device 40*a* and one variable resistive device 50*a* may constitute a unit memory cell Mc. The switching device 40*a* and a portion of the variable resistive device 50*a* may be disposed within a first hole 220*h* and integrally confined by a first interlayer insulating layer 220. The first hole 220*h* may have, for example, a planar sectional structure with a circuit shape. An active region 214 may be defined by an isolation region 212 in the substrate 210. The lower conductive line 20*a* may be formed by, for example, implanting impurity ions into the active region 214. The lower conductive line 20*a* may be interpreted as a word line WL configured to extend in a first direction of the substrate 210. The upper conductive line 30*a* may be interpreted as a bit line BL configured to extend in a second direction of the substrate 210. The upper conductive line 30*a* may intersect the lower conductive line 20*a*.

The switching device 40*a* may include, for example, a vertical cell diode D including an n-type lower semiconductor pattern 232 and a p-type upper semiconductor pattern 234 vertically stacked. A silicide pattern 240 may be disposed between the switching device 40*a* and the variable resistive device 50*a*. The silicide pattern 240 may be, for example, an ohmic contact layer obtained by annealing a metal layer. The metal layer may include, for example, Co, Ni, W, or Ti. Accordingly, the ohmic contact layer may include, for example, $CoSi_2$, $NiSi_2$, $WSi_2$, or $TiSi_2$.

The variable resistive device 50*a* may include, for example, a lower electrode pattern 260, a variable resistive pattern 270, and an upper electrode pattern 280 and serve a memory function between the lower and upper conductive lines 20*a* and 30*a*. The lower electrode pattern 260 may be partially removed as a half type using, for example, a trim process. The lower electrode pattern 260 may have, for example, an arc-shaped plane sectional structure or an L-shaped longitudinal sectional structure. Since a spacer insulating pattern 218 is disposed between the lower electrode pattern 260 and the first interlayer insulating layer 220, the size of the lower electrode pattern 260 may be reduced and thus, a reset current may be reduced. Since a core insulating pattern 262 is disposed within the lower electrode pattern 260, the lower electrode pattern 260 may have a 3-dimensional structure having, for example, a top-open cylindrical or half cylindrical shape. Also, the lower electrode pattern 260 may include a high-resistivity material, such as, for example, a C layer, a CN layer, a TiN layer, a TiAlN layer, a TiSiN layer, a TiCN layer, a WN layer, a CoSiN layer, a WSiN layer, a TaN layer, a TaCN layer, or a TaSiN layer. For example, the variable resistive pattern 270 may include a phase-change material GST including chalcogenide elements, such as an alloy of Ge, Sb, and Te. In addition to the phase-change material GST, the variable resistive pattern 270 may further contain, for example, doped C, N, Si, or O. The upper electrode pattern 280 may include the same material as the lower electrode pattern 260. Further, for example, as shown in FIG. 3B, the variable resistive pattern 270, the upper electrode pattern 280 and the upper conductive line 30*a* may be disposed in a second interlayer insulating layer 224, a third interlayer insulating layer 226 and a fourth interlayer insulating layer 228, respectively.

The semiconductor device 10*a* may include, for example, a buffer electrode pattern 250 interposed between the silicide pattern 240 and the lower electrode pattern 260 and having an etch selectivity with respect to the lower electrode pattern 260. For example, the buffer electrode pattern 250 may prevent the ohmic contact layer from being damaged due to overetching during the trim process for partially removing the lower electrode pattern 260. Also, since the buffer electrode pattern 250 is interposed between the silicide pattern 240 and the lower electrode pattern 260, the height and length of the lower electrode pattern 260 may be reduced, and dynamic resistance may be reduced. The buffer electrode pattern 250 may include, for example, a Ti layer, a TiN layer, a Ta layer, a TaN layer, a W layer, a WN layer, a Ni layer, or a NiN layer so that contact resistance between the silicide pattern 240 and the lower electrode pattern 260 can be reduced. Further, as shown in FIG. 3B, a spacer insulating pattern 218 may be formed along the sidewall of the first interlayer insulating layer 220 and on the buffer electrode pattern 250 in alignment with an outer lateral surface of the buffer electrode pattern 250.

To reduce a contact area and contact resistance between the lower electrode pattern 260 and the variable resistance pattern 270, the semiconductor device 10*a* may further include, for example, a trench 220*t* and a trim insulating pattern 264 in place of a portion of the lower electrode pattern 260. For example, as shown in FIG. 3B, the trim insulating pattern 264 is formed in the trench 220t. The trench 220t may horizontally extend to the spacer insulating pattern 218 and the first interlayer insulating layer 220, and vertically extend to an upper portion of the buffer electrode pattern 250. Thus, one side of a top surface of the lower electrode pattern 260 may contact the variable resistive pattern 270, while the other side thereof may be cut off from the variable resistive pattern 270 by the trim insulating pattern 264 so that the lower electrode pattern 260 may have, for example, an asymmetrical L-shaped longitudinal sectional structure. Accordingly, the phase-change material may be sufficiently heated with only a small current. For example, the lower electrode pattern 260 may include a first pattern 260a configured to contact the buffer electrode pattern 250 and extend in a direction parallel to the substrate 210, and a second pattern 260b configured to contact the variable resistive pattern 270 and extend in a direction vertical to the substrate 210. The first pattern 260a may, for example, partially overlap the buffer electrode pattern 250. Top surfaces of the core insulating pattern 262 and the trim insulating pattern 264 may be, for example, at the same level from the substrate 210. In comparison, a bottom surface of the trim insulating pattern 264 may be, for example, at a lower level from the substrate 210 than a bottom surface of the core insulating pattern 262. A bottom surface level of the trim insulating pattern 264 may be, for example, lower than a bottom surface level of the lower electrode pattern 260. Accordingly, the buffer electrode pattern 250 may include, for example, a first region 250a disposed under the lower electrode pattern 260 and having a first thickness t1, and a second region 250b disposed under the trim insulating pattern 264 and having a second thickness t2 smaller than the first thickness t1. The buffer electrode pattern 250 may have, for example, a stepwise structure due to the first and second regions 250a and 250b with different thicknesses. The first region 250a may have the same sectional area as the second region 250b.

Figure 4A:
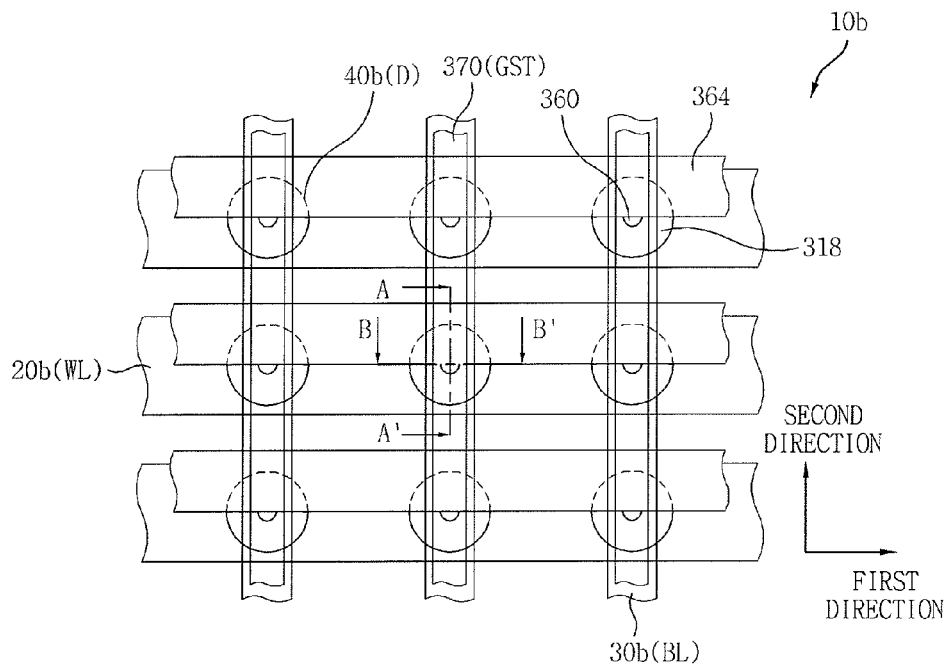
FIGS. 4A and 4B are a conceptual layout diagram and longitudinal sectional view of a semiconductor device according to an exemplary embodiment of the inventive concept, respectively.
Figure 4B:
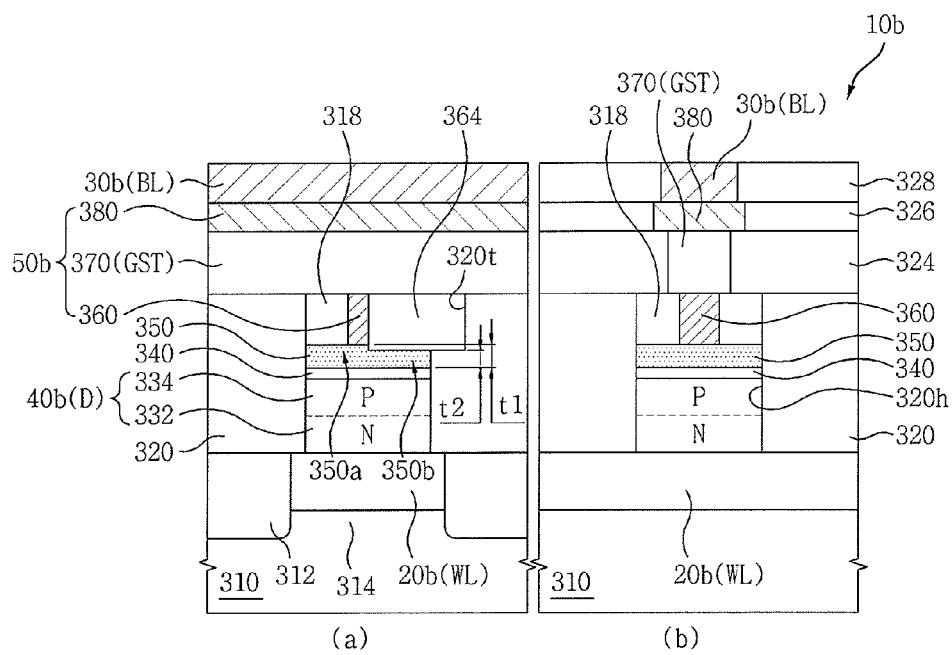

FIG. 4A is a plan view illustrating the layout of a semiconductor device according to an exemplary embodiment of the inventive concept, and (a) and (b) of FIG. 4B are schematic longitudinal sectional views taken along lines A-A' and B-B' of FIG. 4A, respectively.

Referring to FIGS. 4A and 4B, a semiconductor device 10b according to the an exemplary embodiment of the inventive concept may include, for example, a substrate 310, a lower conductive line 20b, an upper conductive line 30b, a switching device 40b, and a variable resistive device 50b. One switching device 40b and one variable resistive device 50b may constitute a unit memory cell Mc. The switching device 40b and a portion of the variable resistive device 50b may be disposed within a first hole 320h and integrally confined by a first interlayer insulating layer 320. The first hole 320h may have, for example, a circular plane sectional structure. An active region 314 may be defined by an isolation region 312 within the substrate 310. The lower conductive line 20b may be formed by, for example, implanting impurity ions into the active region 314. The lower conductive line 20b may be interpreted as a word line WL extending in a first direction of the substrate 310. The upper conductive line 30b may be interpreted as a bit line BL extending in a second direction of the substrate 310. The upper conductive line 30b may intersect the lower conductive line 20b.

The switching device 40b may include, for example, a vertical cell diode D including an n-type lower semiconductor pattern 332 and a p-type upper semiconductor pattern 334 vertically stacked. A silicide pattern 340 may be further provided between the switching device 40b and the variable resistive device 50b. The silicide pattern 340 may be, for example, an ohmic contact layer obtained by annealing a metal layer, such as a Co layer, a Ni layer, a W layer, or a Ti layer. Thus, the ohmic contact layer may include, for example, $CoSi_2$, $NiSi_2$, $WSi_2$, or $TiSi_2$.

The variable resistive device 50b may include, for example, a lower electrode pattern 360, a variable resistive pattern 370, and an upper electrode pattern 380, which may serve a memory function between the lower and upper conductive lines 20b and 30b. The lower electrode pattern 360 may be partially removed as a half type using, for example, a trim process. For example, a lower region of the lower electrode pattern 360 contacting a buffer electrode pattern 350 may have substantially the same shape as an upper region of the lower electrode pattern 360 contacting the variable resistive pattern 370 so that the lower electrode pattern 360 can have a 3-dimensional structure with a half pillar shape. The half pillar shape may refer to a plane sectional shape obtained by vertically cutting a cylinder or polygonal pillar. For example, the half pillar shape may refer to a semicircular, semielliptical, or bisected-rectangular plane sectional shape. For example, by partially removing the lower electrode pattern 360 using a trim process to reduce its size and a reset current, the pillar-type 3-dimensional structure may be modified into a half-pillar-type 3-dimensional structure. Also, the lower electrode pattern 360 may include a high-resistivity material layer, such as, for example, a C layer, a CN layer, a TiN layer, a TiAlN layer, a TiSiN layer, a TiCN layer, a WN layer, a CoSiN layer, a WSiN layer, a TaN layer, a TaCN layer, or a TaSiN layer. The variable resistive pattern 370 may include, for example, a phase-change material GST including chalcogenide elements, such as an alloy of Ge, Sb, and Te. The upper electrode pattern 380 may include the same material as the lower electrode pattern 360. In addition, for example, as shown in FIG. 4B, the variable resistive pattern 370, the upper electrode pattern 380 and the upper conductive line 30b may be disposed in a second interlayer insulating layer 324, a third interlayer insulating layer 326 and a fourth interlayer insulating layer 328, respectively.

The semiconductor device 10b may include, for example, the buffer electrode pattern 350 interposed between the silicide pattern 340 and the lower electrode pattern 360 and having an etch selectivity with respect to the lower electrode pattern 360. For example, the buffer electrode pattern 350 may prevent the ohmic contact layer from being damaged due to overetching during the trim process for partially removing the lower electrode pattern 360. Also, since the buffer electrode pattern 350 is interposed between the silicide pattern 340 and the lower electrode pattern 360, the height and length of the lower electrode pattern 360 may be reduced, and dynamic resistance may be reduced. The buffer electrode pattern 350 may include, for example, a Ti layer, a TiN layer, a Ta layer, a TaN layer, a W layer, a WN layer, a Ni layer, or a NiN layer so that contact resistance between the silicide pattern 340 and the lower electrode pattern 360 can be reduced. Further, as shown in FIG. 4B, a spacer insulating pattern 318 may be formed along the sidewall of the first interlayer insulating layer 320 and on the buffer electrode pattern 350 in self-alignment with an edge of the buffer electrode pattern 350.

To reduce a contact area and contact resistance between the lower electrode pattern 360 and the variable resistance pattern 370, the semiconductor device 10b may further include, for example, a trench 320t and a trim insulating pattern 364 configured to partially trim the lower electrode pattern 360. For example, as shown in FIG. 4B, the trim insulating pattern 364 is formed in the trench 320t. The trench 320t may horizontally extend to the spacer insulating pattern 318 and the first interlayer insulating layer 320 and vertically extend to an upper portion of the buffer electrode pattern 350. Thus, due to the trim insulating pattern 364, one side of the lower electrode pattern 360 may contact the variable resistive pattern 370 so that the lower electrode pattern 360 may have an asymmetrical structure. Thus, the phase-change material GST may be sufficiently heated with only a small current. A bottom surface level of the trim insulating pattern 364 may be, for example, lower than a bottom surface level of the lower electrode pattern 360. Accordingly, the buffer electrode pattern 350 may include, for example, a first region 350a disposed under the lower electrode pattern 360 and having a first thickness t1, and a second region 350b disposed under the trim insulating pattern 364 and having a second thickness t2 smaller than the first thickness t1. The buffer electrode pattern 350 may have, for example, a stepwise structure due to the first and second regions 350a and 350b with different thicknesses. The first region 350a may have the same sectional area as the second region 350b.

Figure 5A:
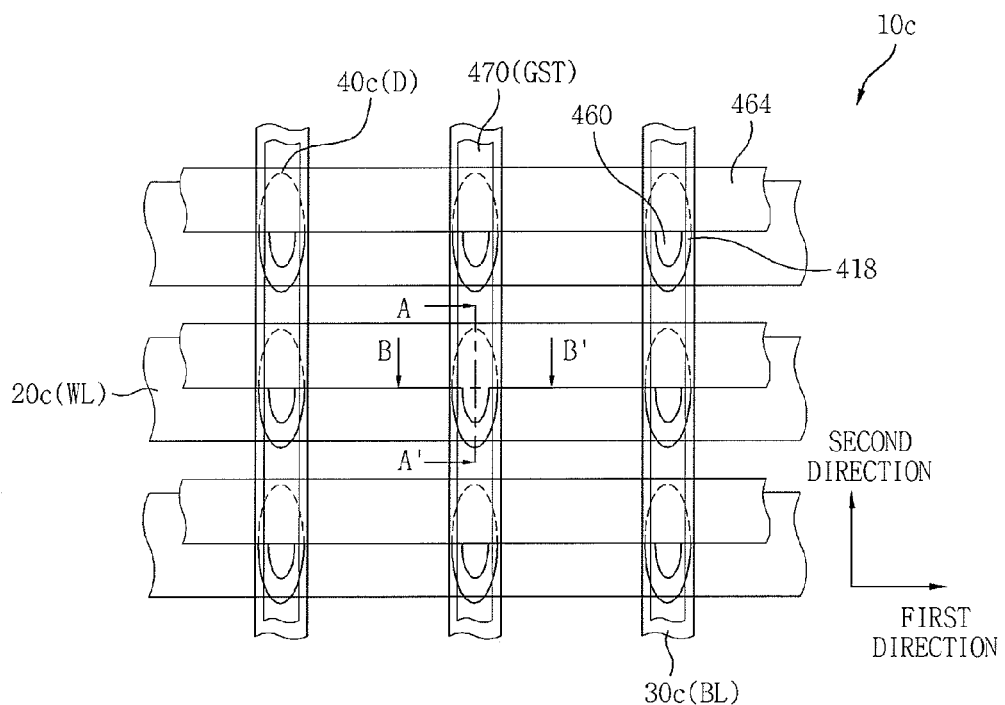
FIGS. 5A and 5B are a conceptual layout diagram and longitudinal sectional view of a semiconductor device according to an exemplary embodiment of the inventive concept, respectively.
Figure 5B:
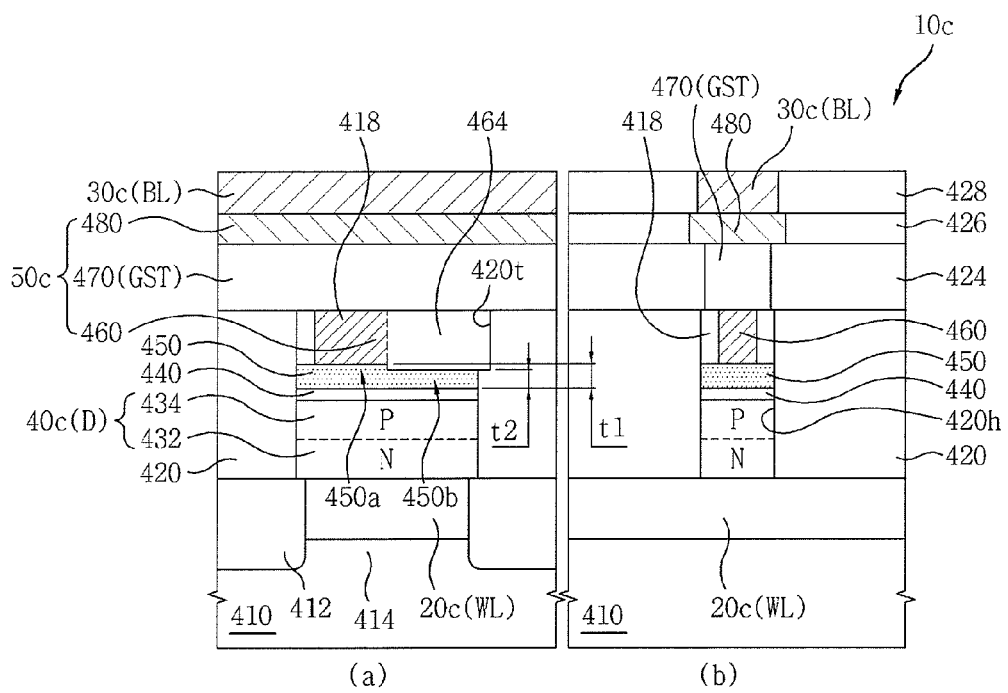

FIG. 5A is a plan view illustrating the layout of a semiconductor device according to an exemplary embodiment of the inventive concept, and (a) and (b) of FIG. 5B are schematic longitudinal sectional views taken along lines A-A' and B-B' of FIG. 5A, respectively.

Referring to FIGS. 5A and 5B, a semiconductor device 10c according to an exemplary embodiment of the inventive concept may include, for example, a substrate 410, a lower conductive line 20c, an upper conductive line 30c, a switching device 40c, and a variable resistive device 50c. One switching device 40c and one variable resistive device 50c may constitute a unit memory cell Mc. The switching device 40c and a portion of the variable resistive device 50c may be disposed in a first hole 420h and integrally confined by a first interlayer insulating layer 420. The first hole 420h may have, for example, an elliptical plane sectional structure. An active region 414 may be defined by an isolation region 412 within the substrate 410. The lower conductive line 20c may be formed by, for example, implanting impurity ions into the active region 414. The lower conductive line 20c may be interpreted as a word line WL extending in a first direction of the substrate 410. The upper conductive line 30c may be interpreted as a bit line BL extending in a second direction of the substrate 410. The upper conductive line 30c may intersect the lower conductive line 20c.

The switching device 40c may include, for example, a vertical cell diode D including an n-type lower semiconductor pattern 432 and a p-type upper semiconductor pattern 434 vertically stacked. A silicide pattern 440 may be further provided between the switching device 40c and the variable resistive device 50c. The silicide pattern 440 may be, for example, an ohmic contact layer including a metal silicide, which may be obtained by annealing a metal layer.

The variable resistive device 50c may include, for example, a lower electrode pattern 460, a variable resistive pattern 470, and an upper electrode pattern 480, which may serve a memory function between the lower and upper conductive lines 20c and 30c. The lower electrode pattern 460 may be partially removed as a half type using, for example, a trim process. For example, a lower region of the lower electrode pattern 460 contacting the buffer electrode pattern 450 may have substantially the same shape as an upper region of the lower electrode pattern 460 contacting the variable resistive pattern 470 so that the lower electrode pattern 460 can have a 3-dimensional structure with a half-line or dash shape. For instance, by partially removing the lower electrode pattern 460 using a trim process to reduce its size and a reset current, a line-type 3-dimensional structure may be modified into a half-line-type 3-dimensional structure. Also, the lower electrode pattern 460 may include a high-resistivity material layer, such as, for example, a TiAlN layer, a TiSiN layer, or a TiCN layer. The variable resistive pattern 470 may include, for example, a phase-change material GST including chalcogenide elements, such as an alloy of Ge, Sb, and Te. The upper electrode pattern 480 may include the same material as the lower electrode pattern 460. For example, as shown in FIG. 5B, the variable resistive pattern 470, the upper electrode pattern 480 and the upper conductive line 30c may be disposed in a second interlayer insulating layer 424, a third interlayer insulating layer 426 and a fourth interlayer insulating layer 428, respectively.

The semiconductor device 10c may include, for example, a buffer electrode pattern 450 interposed between the silicide pattern 440 and the lower electrode pattern 460 and having an etch selectivity with respect to the lower electrode pattern 460. For example, the buffer electrode pattern 450 may prevent the ohmic contact layer from being damaged due to overetching during the trim process for partially removing the lower electrode pattern 460. Also, the buffer electrode pattern 450 may be interposed between the silicide pattern 440 and the lower electrode pattern 460 so that the height and length of the lower electrode pattern 460 can be reduced, and a dynamic resistance can be reduced. The buffer electrode pattern 450 may include, for example, a Ti layer, a TiN layer, a Ta layer, a TaN layer, a W layer, a WN layer, a Ni layer, or a NiN layer and thus, contact resistance between the silicide pattern 440 and the lower electrode pattern 460 may be minimized. Further, as shown in FIG. 5B, a spacer insulating pattern 418 may be formed along the sidewall of the first interlayer insulating layer 420 and on the buffer electrode pattern 450 in alignment with an outer lateral surface of the buffer electrode pattern 450.

To reduce a contact area and contact resistance between the lower electrode pattern 460 and the variable resistive pattern 470, the semiconductor device 10c may include a trench 420t and a trim insulating pattern 464 configured to partially trim the lower electrode pattern 460. For example, as shown in FIG. 5B, the trim insulating pattern 464 is formed in the trench 420t. The trench 420t may horizontally extend to the spacer insulating pattern 418 and the first interlayer insulating layer 420 and vertically extend to an upper portion of the buffer electrode pattern 450. Thus, due to the trim insulating pattern 464, only one side of the lower electrode pattern 460 may contact the variable resistive pattern 470 so that the lower electrode pattern 460 can have, for example, an asymmetrical structure. Thus, the phase-change material GST may be sufficiently heated with only a small current. A bottom surface level of the trim insulating pattern 464 may be, for example, lower than a bottom surface level of the lower electrode pattern 460. Accordingly, the buffer electrode pattern 450 may include, for example, a first region 450a disposed under the lower electrode pattern 460 and having a first thickness t1, and a second region 450b disposed under the trim insulating pattern 464 and having a second thickness t2 smaller than the first thickness t1. The buffer electrode pattern 450 may have, for example, a stepwise structure due to the first and second regions 450a and 450b with different thicknesses. The first region 450a may have the same sectional area as the second region 450b.

Hereinafter, a method of fabricating a semiconductor device according to an exemplary embodiment of the inventive concept will be described in detail with reference to the appended drawings.

Figure 6A:
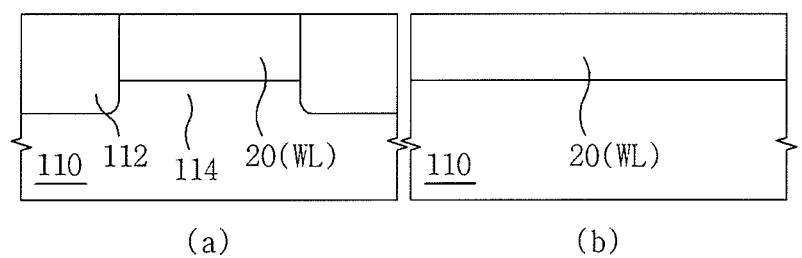
FIGS. 6A through 9I are cross-sectional views illustrating methods of fabricating various semiconductor devices according to an exemplary embodiment of the inventive concept.
Figure 6B:
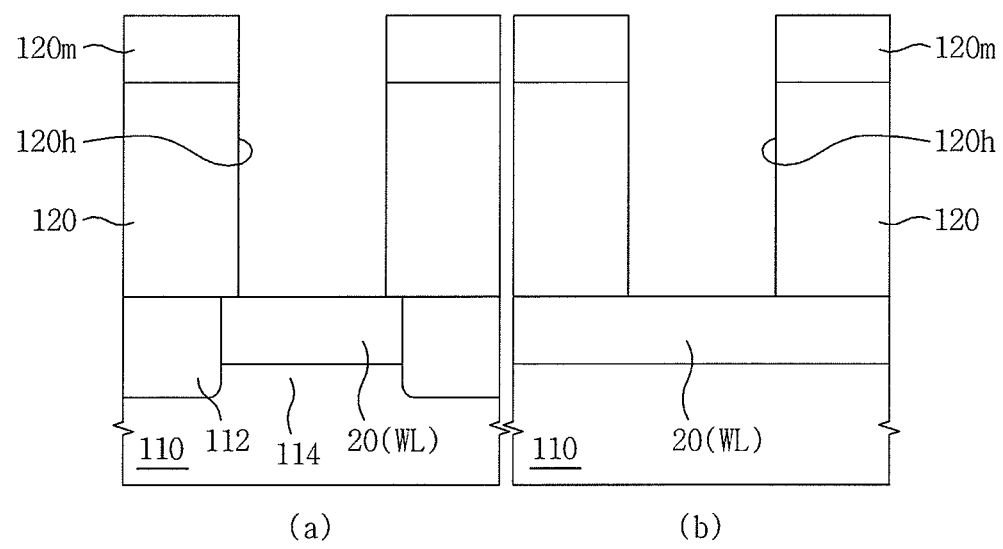
Figure 6C:
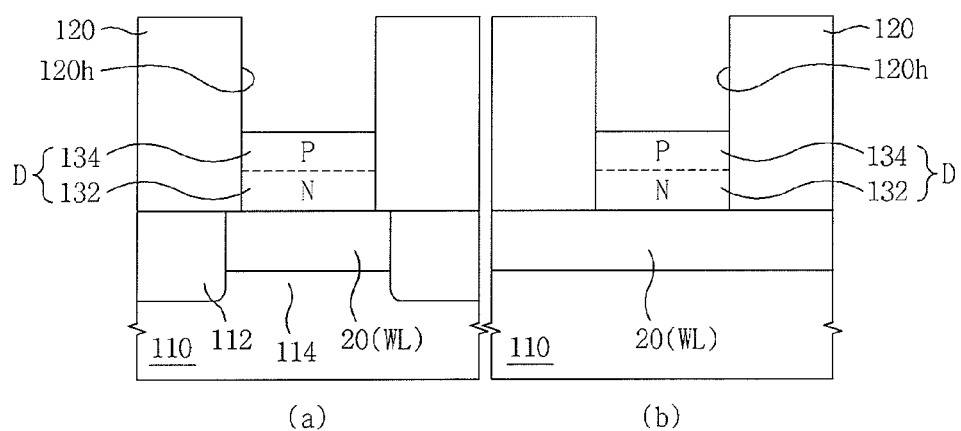
Figure 6D:
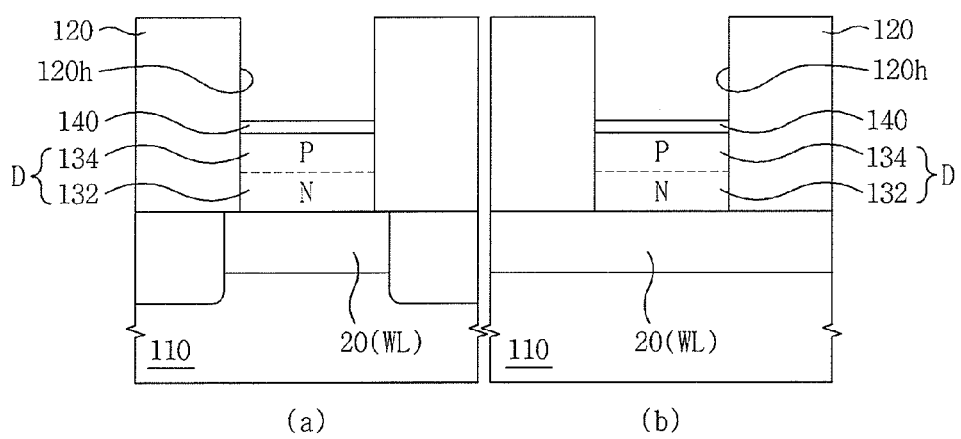
Figure 6E:
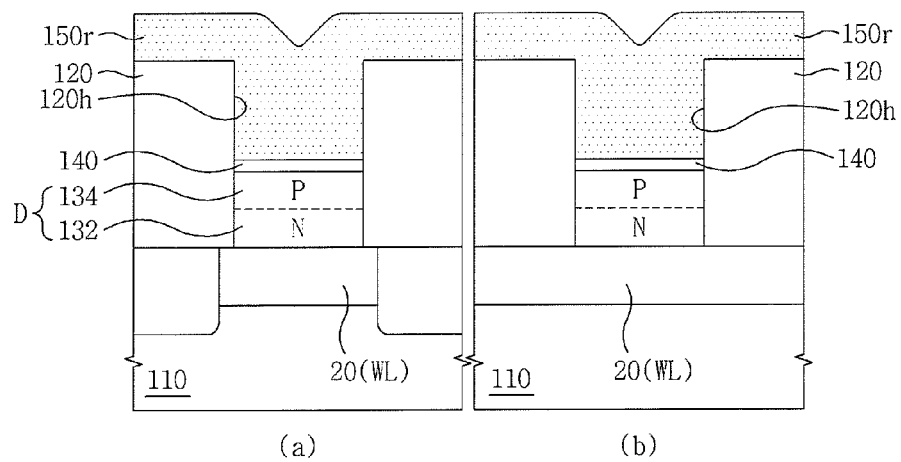
Figure 6F:
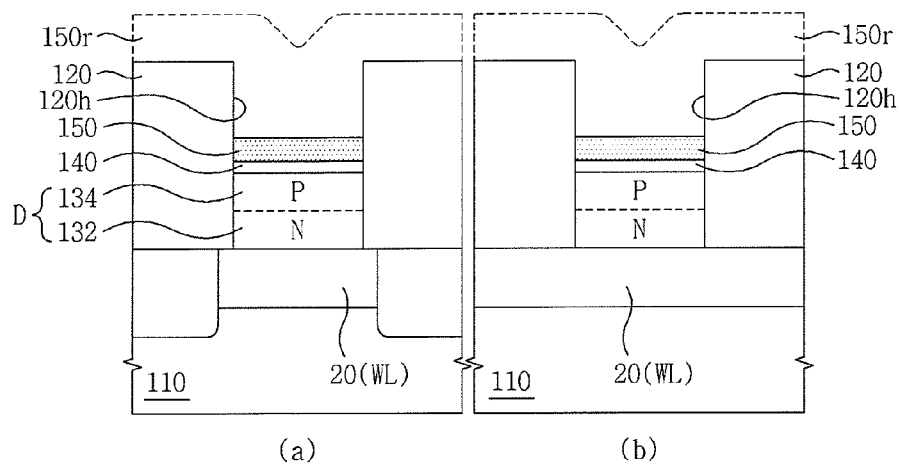
Figure 6G:
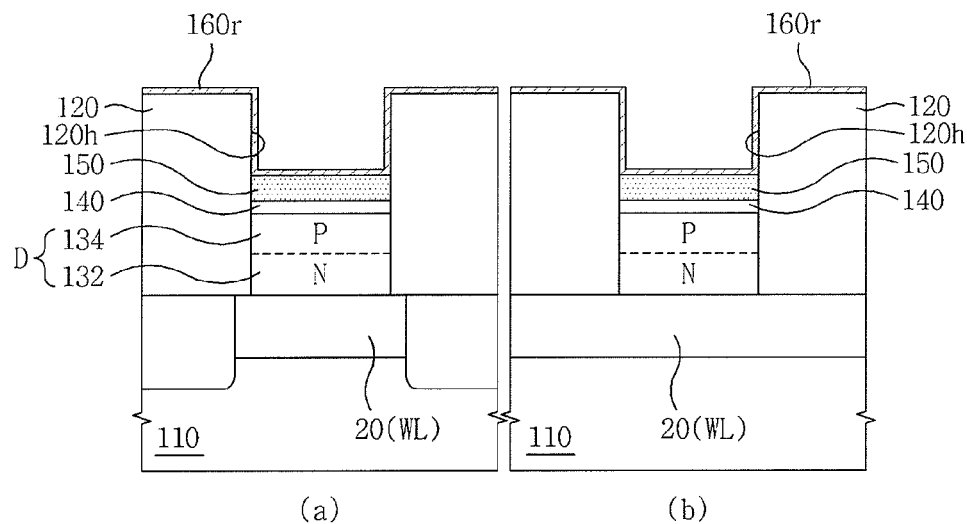
Figure 6H:
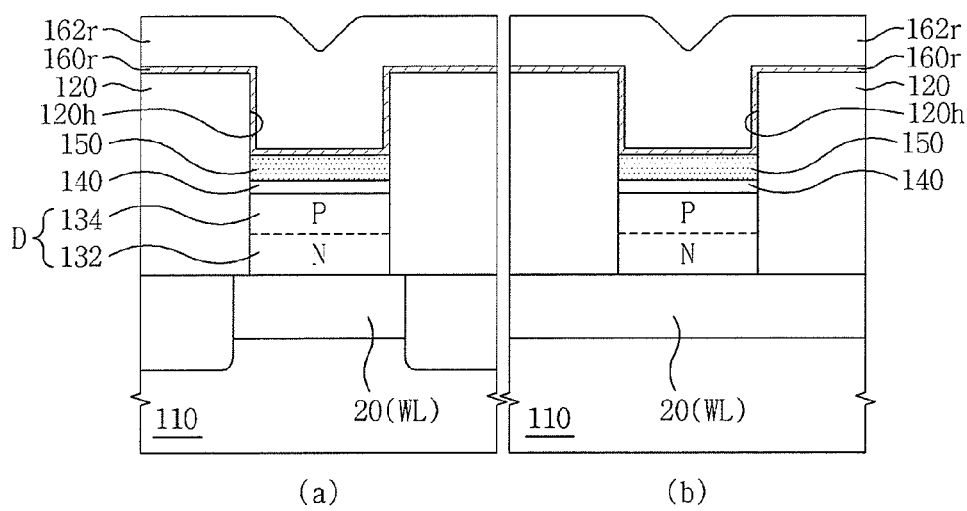
Figure 6I:
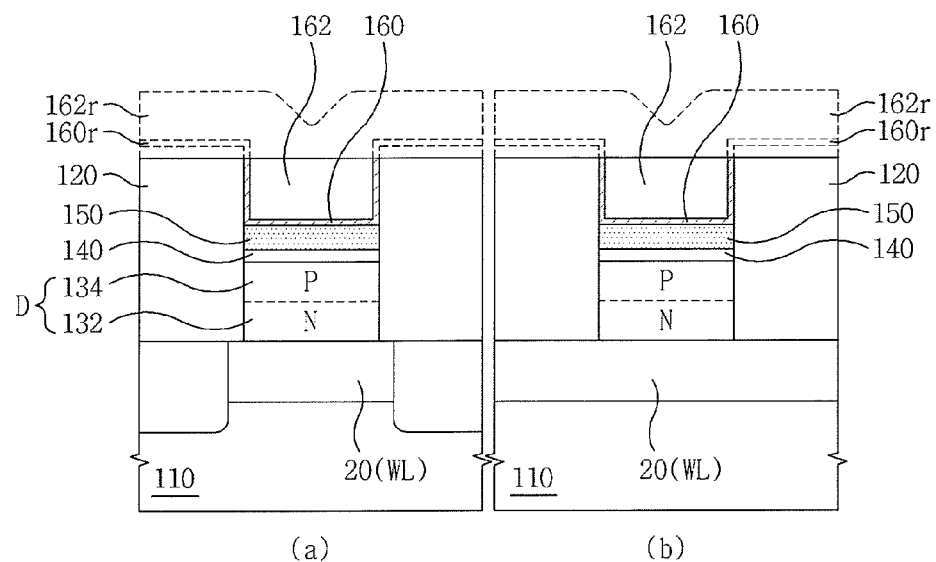
Figure 6J:
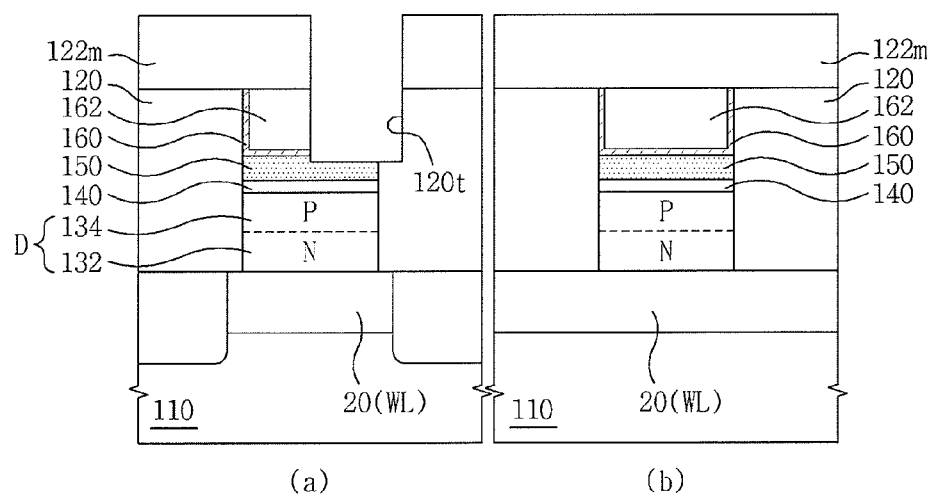
Figure 6K:
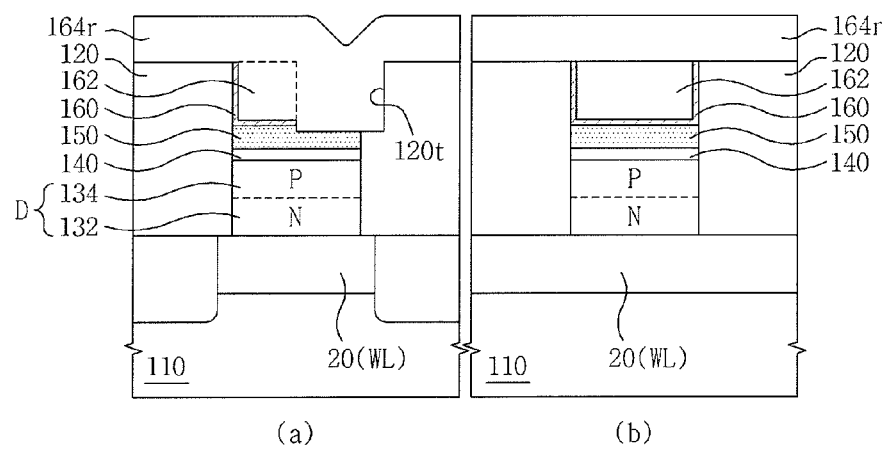
Figure 6L:
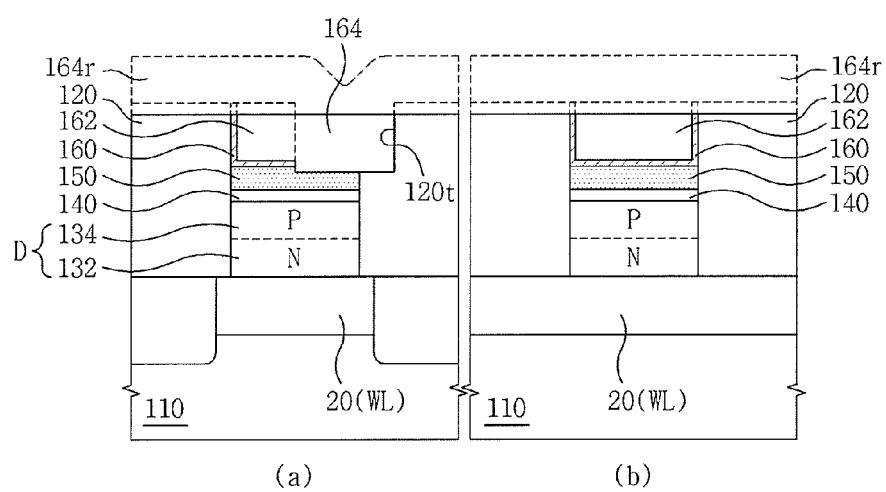
Figure 6M:
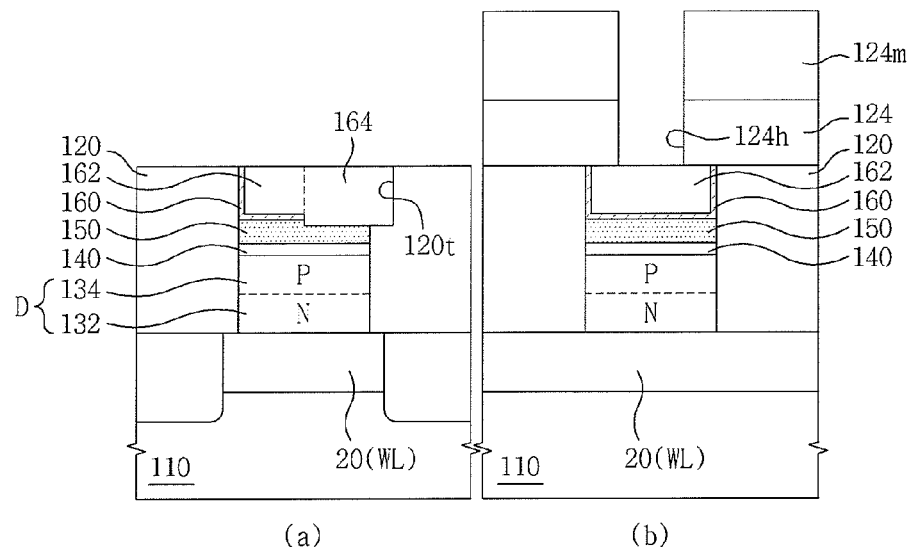
Figure 6N:
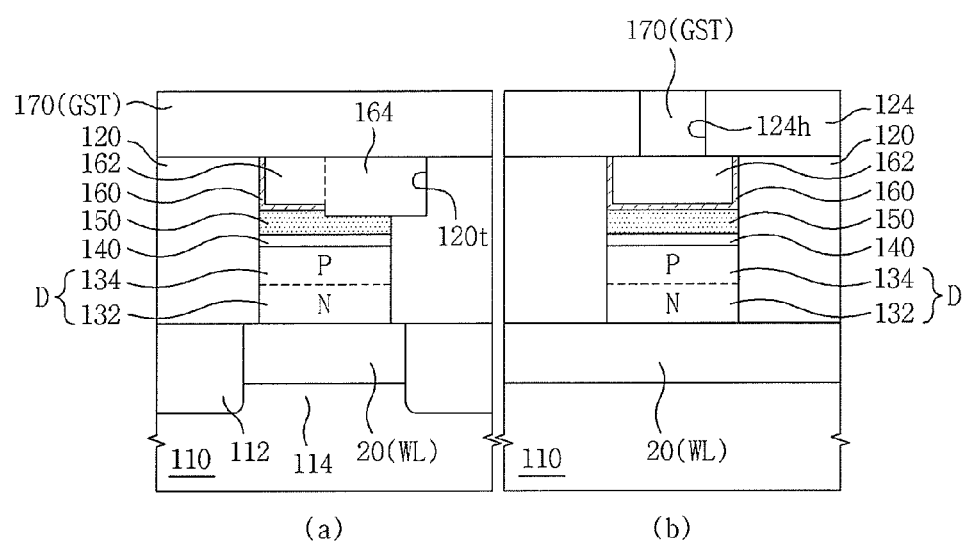
Figure 6O:
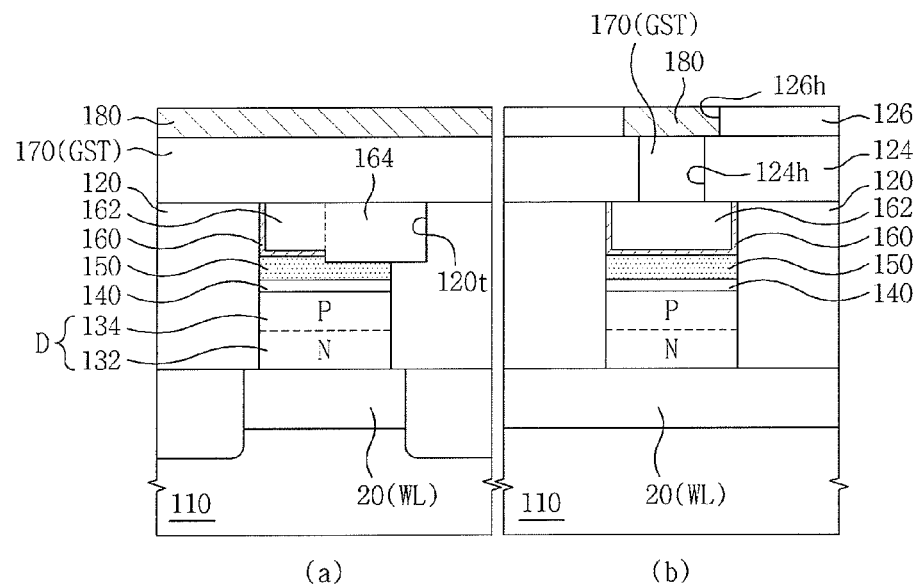
Figure 6P:
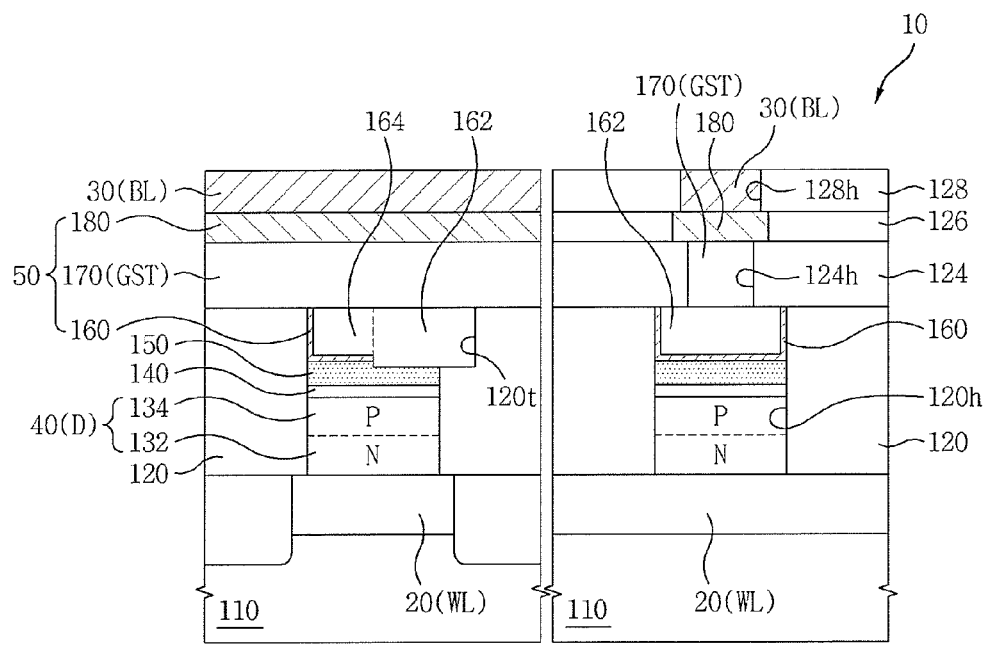

FIGS. 6A through 6P are longitudinal sectional views illustrating a method of fabricating the semiconductor device of FIG. 2B, according to an exemplary embodiment of the inventive concept.

Referring to FIG. 6A, a lower conductive line 20 may be formed within a substrate 110. For example, an isolation trench (not shown) defining an active region 114 in the substrate 110 may be formed, and an isolation region 112 filling an isolation trench may be formed so that the active region 114 may be defined by the isolation region 112. Impurity ions may be, for example, heavily implanted into the active region 114 so that the active region 114 may be used as the lower conductive line 20. The lower conductive line 20 may extend in a first direction of the substrate 110. The substrate 110 may include, for example, a Si substrate, a Ge substrate, a SiGe substrate, an SOI substrate, or a GOI substrate. The conductivity type of the lower conductive line 20 may depend on the kind of the impurity ions. For instance, when the substrate 110 has a p-type of conductivity, the impurity ions may include P ions, As ions, or Sb ions so that the lower conductive line 20 may have an n-type of conductivity. When the substrate 110 has an n-type of conductivity, the impurity ions may include, for example, B ions, gallium (Ga) ions, or indium (In) ions so that the lower conductive line 20 may have a p-type of conductivity. Thus, the lower conductive line 20 may have a different conductivity type from the substrate 110 and serve as a word line WL. In another case, the lower conductive line 20 may be formed using, for example, an epitaxial growth process. In yet another case, the lower conductive line 20 may be formed using, for example, a metal thin layer.

Referring to FIG. 6B, a first interlayer insulating layer 120 may be formed on the substrate 110. A plurality of first holes 120h may be formed in the first interlayer insulating layer 120 and 2-dimensionally arranged in first and second directions of the substrate 110. Each of the first holes 120h may have, for example, a planar sectional structure with a circular shape. For example, a first mask pattern 120m may be formed on the first interlayer insulating layer 120, and portions of the first interlayer insulating layer 120 may be anisotropically etched using the first mask pattern 120m as an etch mask, thereby forming the first holes 120h to expose the substrate 110. The first mask pattern 120m may include a photoresist pattern formed using, for example, a photolithography process. The anisotropic etching process may include, for example, a dry etching process, such as a reactive ion etching (RIE) process or a plasma etching process. The first mask pattern 120m may be removed. The first holes 120h may be arranged along the lower conductive line 20. The first holes 120h may expose the lower conductive line 20. When a plurality of memory cells Mc are formed on the substrate 110, the first interlayer insulating layer 120 may function to electrically insulate the respective memory cells Mc from one another. The first interlayer insulating layer 120 may include, for example, a silicon nitride (SiN) layer, a silicon oxide ($SiO_2$) layer, or a silicon oxynitride (SiON) layer. Alternatively, the first interlayer insulating layer 120 may have, for example, a multiple structure obtained by sequentially or alternately stacking at least one $SiO_2$ layer, at least one SiN layer, and/or at least one SiON layer on the substrate 110.

Referring to FIG. 6C, a lower and upper semiconductor pattern 132 and 134 may be sequentially formed within the first holes 120h. The lower semiconductor pattern 132 may contact a top surface of the lower conductive line 20. The lower semiconductor pattern 132 may be obtained using, for example, a selective epitaxial growth process. In this case, the lower conductive line 20 exposed by the first hole 120h may function as a seed layer of the lower semiconductor pattern 132. The upper semiconductor pattern 134 may be, for example, selectively epitaxially grown using the lower semiconductor pattern 132 as a seed layer. In another case, the lower semiconductor pattern 132 may be formed using, for example, a chemical vapor deposition (CVD) process. For instance, a semiconductor layer may be deposited using, for example, a CVD process to fill the first hole 120h, and etched back until a sidewall of an upper region of the first hole 120h is exposed, thereby controlling the thickness of the semiconductor layer. Thereafter, impurity ions may be implanted to form the lower semiconductor pattern 132 having the same conductivity type as the lower conductive line 20. The upper semiconductor pattern 134 may have, for example, a different conductivity type from the lower conductive line 20. Thus, the upper and lower semiconductor patterns 134 and 132 may constitute a vertical cell diode D electrically connected to the lower conductive line 20. Since a top surface level of the vertical cell diode D is lower than a top surface level of the first interlayer insulating layer 120, the vertical cell diode D may be disposed in a lower portion of the first hole 120h.

Referring to FIG. 6D, a silicide pattern 140 may be formed on the upper semiconductor pattern 134. For example, a metal layer may be formed on the upper semiconductor pattern 134 and annealed, thereby forming the silicide pattern 140 functioning as an ohmic contact layer. The ohmic contact layer may be formed on the vertical cell diode D, thereby facilitating the flow of current from the upper semiconductor pattern 134 to a lower electrode pattern (refer to 160 in FIG. 6I) that will be formed in a subsequent process. The metal layer may include, for example, Co, W, Ni, or Ti. The metal layer may be obtained using, for example, a physical vapor deposition (PVD) process, a CVD process, or an atomic layer deposition (ALD) process. The annealing of the metal layer may be performed using, for example, a rapid thermal annealing (RTA) process. Since the silicide pattern 140 is confined in the first hole 120h, the silicide pattern 140 may be self-aligned with the vertical cell diode D. The silicide pattern 140 may be formed to a thickness between, for example, about 150 Å and about 250 Å.

Meanwhile, when a buffer electrode layer (refer to 150r in FIG. 6E) to be subsequently formed includes, for example, a Ti layer and/or a TiN layer, a titanium silicide may be formed without an additional silicide process. Accordingly, in this case, the process described above with reference to FIG. 6D may be omitted.

Referring to FIG. 6E, a buffer electrode layer 150r filling the first hole 120h may be formed. The buffer electrode layer 150r may be deposited to such a sufficient thickness as to fill the first hole 120h. The buffer electrode layer 150r may be obtained using, for example, a PVD or CVD process. The buffer electrode layer 150r may include, for example, a metal layer and/or a metal nitride layer capable of suppressing an increase in contact resistance between the silicide pattern 140 and a lower electrode pattern (refer to 160 in FIG. 6I) to be subsequently formed. The metal layer and/or the metal nitride layer may include, for example, Ti, TiN, Ta, TaN, W, WN, Ni, or NiN.

Referring to FIG. 6F, a buffer electrode pattern 150 may be formed on the silicide pattern 140. The buffer electrode layer 150r may be partially removed using, for example, an etchback process, thereby forming the buffer electrode pattern 150. The buffer electrode pattern 150 may be formed to a thickness between, for example, about 350 Å and about 450 Å.

Referring to FIG. 6G, a lower electrode layer 160r may be formed to a uniform thickness in the first hole 120h. The lower electrode layer 160r may be conformally deposited on the buffer electrode pattern 150 and a sidewall and a top surface of the first interlayer insulating layer 120. Since the first hole 120h is a cylindrical 3-dimensional structure, a 3-dimensional structure of the lower electrode layer 160r formed in the first hole 120h may have, for example, a cup or cylindrical shape. For example, a longitudinal sectional structure of the lower electrode layer 160r formed in the first hole 120h may have a U shape. Accordingly, the lower electrode layer 160r may surround a lower portion of a core insulating pattern (refer to 162 in FIG. 6I) to be subsequently formed. The lower electrode layer 160r may be obtained using, for example, a PVD process, a CVD process, an ALD process, or an electron beam (e-beam) evaporation process. The lower electrode layer 160r may include a high-resistivity material, such as, for example, C, CN, TiN, TiAlN, TiSiN, TiCN, WN, CoSiN, WSiN, TaN, TaCN, or TaSiN.

Referring to FIG. 6H, a core insulating layer 162r having insulating properties may be formed on the lower electrode layer 160r. The core insulating layer 162r may be formed to such a sufficient thickness as to fill the inside of the cylindrical lower electrode layer 160r and cover the top surface of the first interlayer insulating layer 120. The core insulating layer 162r may be formed using a material layer having an etch selectivity with respect to the first interlayer insulating layer 120. The core insulating layer 162r may include, for example, a silicon oxide layer, a silicon nitride layer, a silicon oxynitride layer, or a combination thereof.

Referring to FIG. 6I, the lower electrode layer 160r and the core insulating layer 162r may be planarized using, for example, a chemical mechanical polishing (CMP) process or an etchback process. The CMP process may be performed until the top surface of the first interlayer insulating layer 120 is exposed. As a result, the thickness of the core insulating layer 162r may be reduced, thereby forming a lower electrode pattern 160 and a core insulating pattern 162. In this case, the lower electrode pattern 160 may have, for example, a cylindrical 3-dimensional structure or a U-shaped longitudinal sectional structure, and surround a bottom and lateral surface of the core insulating pattern 162.

Referring to FIG. 6J, the lower electrode pattern 160 and the core insulating pattern 162 may be partially removed or recessed using, for example, a trim process. During the removal or recess process, the first interlayer insulating layer 120 may be partially removed. For example, a second mask pattern 122m may be formed on the substrate 110 to partially expose the lower electrode pattern 160, the core insulating pattern 162, and the first interlayer insulating layer 120. The second mask pattern 122m may include, for example, a photoresist pattern or a hard mask pattern. The lower electrode pattern 160, the core insulating pattern 162, and the first interlayer insulating layer 120 may be anisotropically etched using the second mask pattern 122m as an etch mask, thereby forming a trench 120t. The trench 120t may be formed using, for example, a dry etching process, such as an RIE process or plasma etching process. The second mask pattern 122m may be removed. The trench 120t may horizontally extend to the first interlayer insulating layer 120 and vertically extend to an upper portion of the buffer electrode pattern 150. Thus, a longitudinal sectional structure of the lower electrode pattern 160 may be changed from the U-shaped structure into, for example, an L-shaped structure. Meanwhile, since the buffer electrode pattern 150 is disposed under the lower electrode pattern 160, damage to the silicide pattern 140 due to ions or electrons activated by plasma or excited molecules during the etching of the lower electrode pattern 160 may be prevented. As a result, electrical properties may be maintained at an interface between the silicide pattern 140 and the lower electrode pattern 160.

Referring to FIG. 6K, a trim insulating layer 164r may be formed on the buffer electrode pattern 150. The trim insulating layer 164r may be deposited to such a sufficient thickness as to fill the trench 120t. The trim insulating layer 164r may be formed using a material layer having a higher electrical resistance than the lower electrode pattern 160. Also, the trim insulating layer 164r may be formed using a material layer having an etch selectivity with respect to the first insulating layer 120. The trim insulating layer 164r may include the same material layer as the core insulating pattern 162.

Referring to FIG. 6L, the trim insulating layer 164r may be planarized using, for example, a CMP process or an etchback process. The thickness of the trim insulating layer 164r may be reduced, thereby forming a trim insulating pattern 164. For example, although top surfaces of the core insulating pattern 162 and the trim insulating pattern 164 may become the same level through the planarization process, a bottom surface level of the trim insulating pattern 164 may be lower than a bottom surface level of the core insulating pattern 162 due to the trench 120t. The bottom surface level of the trim insulating pattern 164 may be, for example, lower than a bottom surface level of the lower electrode pattern 160.

Referring to FIG. 6M, a second interlayer insulating layer 124 may be formed on the substrate 110. A plurality of second holes 124h may be formed in the second interlayer insulating layer 124 and extend in the second direction of the substrate 110. For example, a third mask pattern 124m may be formed on the second interlayer insulating layer 124, and the second interlayer insulating layer 124 may be partially etched using the third mask pattern 124m as an etch mask, thereby forming the second holes 124h to expose at least the lower electrode pattern 160. The first mask pattern 124m may include a photoresist pattern formed using, for example, a photolithography process. The second interlayer insulating layer 124 may include, for example, a SiN layer, a $SiO_2$ layer, a SiON layer, an aluminum nitride (AlN) layer, a titanium oxide ($TiO_2$) layer, a tantalum oxide ($Ta_2O_5$) layer, or an aluminum oxide ($AlO_x$) layer.

Referring to FIG. 6N, a variable resistive pattern 170 may be formed within the second hole 124h and contact the lower electrode pattern 160. For instance, a phase-change material layer may be formed on the second interlayer insulating layer 124 and planarized using a CMP process. The variable resistive pattern 170 may have, for example, a line shape extending in the second direction of the substrate 110. In another case, the variable resistive pattern 170 may have, for example, a plug shape so that variable resistive patterns 170 of the respective memory cells Mc can be separated from one another. The phase-change material layer may include a material capable of being switched between a high-resistivity amorphous state and a low-resistivity crystalline state according to heating temperature and time, such as for example, Ge, selenium (Se), tellurium (Te), antimony (Sb), bismuth (Bi), lead (Pb), tin (Sn), As, sulfur (S), Si, P, oxygen (O), or a mixture thereof.

Referring to FIG. 6O, a third interlayer insulating layer 126 may be formed on the substrate 110. A plurality of third holes 126h may be formed in the third interlayer insulating layer 126 and extend in the second direction of the substrate 110. The third holes 126h may expose at least the variable resistive pattern 170. An upper electrode pattern 180 may be formed in each of the third holes 126h and contact the variable resistive pattern 170. The upper electrode pattern 180 may include, for example, a C layer, a CN layer, a TiN layer, a TiAlN layer, a TiSiN layer, a TiCN layer, a WN layer, a CoSiN layer, a WSiN layer, a TaN layer, a TaCN layer, or a TaSiN layer.

Referring to FIG. 6P, a fourth interlayer insulating layer 128 may be formed on the substrate 110. A plurality of fourth holes 128h may be formed in the fourth interlayer insulating layer 128 and extend in the second direction of the substrate 110. The fourth holes 128h may expose at least the upper electrode pattern 180. An upper conductive line 30 may be formed in each of the fourth holes 128h and contact the upper electrode pattern 180. The upper conductive line 30 may include, for example, Ti, W, Si, Cu, Ta, Mo, Ru, Al, Au, platinum (Pt), or Ag. The upper conductive line 30 may be used as a bit line BL.

FIGS. 7A through 7J are longitudinal sectional views illustrating a method of fabricating the semiconductor device of FIG. 3B, according to an exemplary embodiment of the inventive concept.

Figure 7A:
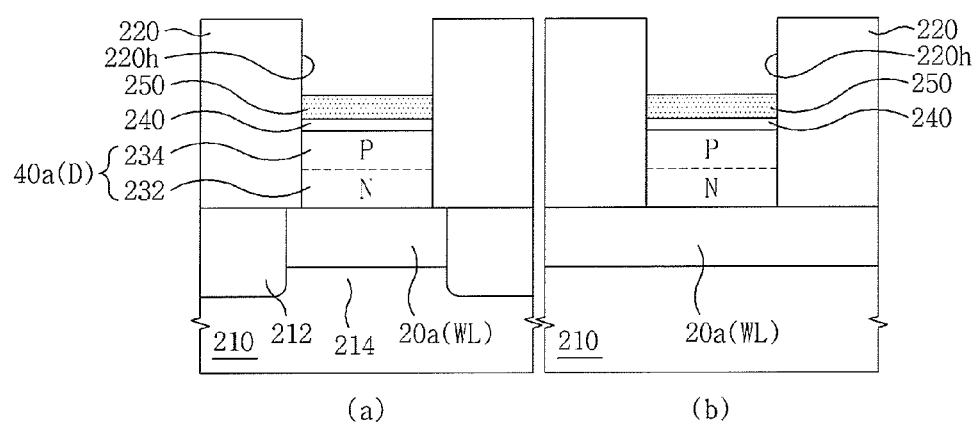

Referring to FIG. 7A, an isolation region 212 defining an active region 214 may be formed within a substrate 210, and impurity ions may be, for example, heavily implanted into the active region 214, thereby forming a lower conductive line 20a in the active region 214. A first interlayer insulating layer 220 may be formed on the substrate 210, and a first hole 220h having, for example, a circular shape may be formed in the first interlayer insulating layer 220 to expose the lower conductive line 20a. An n-type lower semiconductor pattern 232 may be, for example, epitaxially grown in the first hole 220h using the lower conductive line 20a as a seed layer, and a p-type upper semiconductor pattern 234 may be subsequently epitaxially grown in the first hole 220h using the lower semiconductor pattern 232 as a seed layer, thereby forming a vertical cell diode D electrically connected to the lower conductive line 20a. A metal layer, such as, for example, a Co layer, a Ni layer, or a Ti layer, may be deposited on the upper semiconductor pattern 234 and annealed, thereby forming a silicide pattern 240 serving as an ohmic contact layer. The silicide pattern 240 may be formed to a thickness, for example, between about 150 Å and about 250 Å. A buffer electrode pattern 250 may be formed on, for example, the silicide pattern 240 to a thickness between about 350 Å and about 450 Å. The buffer electrode pattern 250 may be formed using, for example, a Ti layer, a TiN layer, a Ta layer, a TaN layer, a W layer, a WN layer, a Ni layer, or a NiN layer.

Figure 7B:
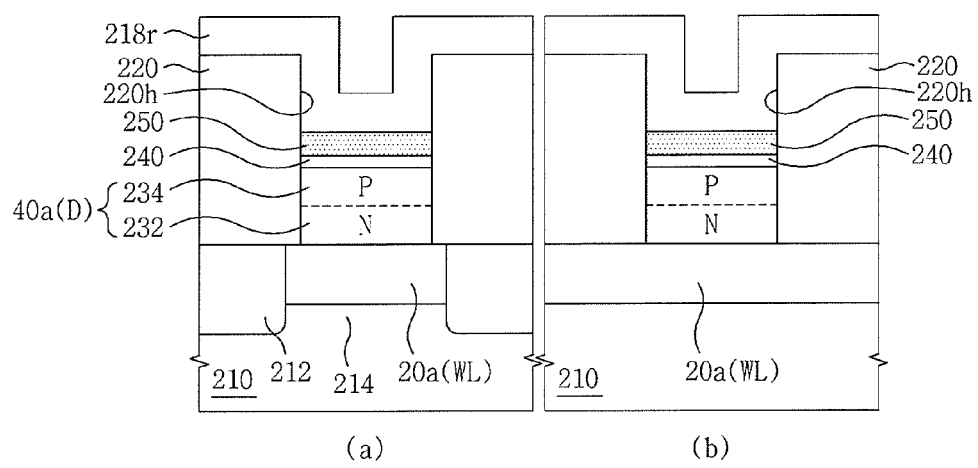

Referring to FIG. 7B, a spacer insulating layer 218r may be formed to a uniform thickness in the first hole 220h. The spacer insulating layer 218r may be conformally deposited on the buffer electrode pattern 250 and a sidewall and top surface of the first interlayer insulating layer 220. The spacer insulating layer 218r may be formed using, for example, a deposition process, such as a CVD process. The spacer insulating layer 218r may be formed using, for example, a SiO₂ layer, a SiN layer, a SiON layer, or a combination thereof.

Figure 7C:
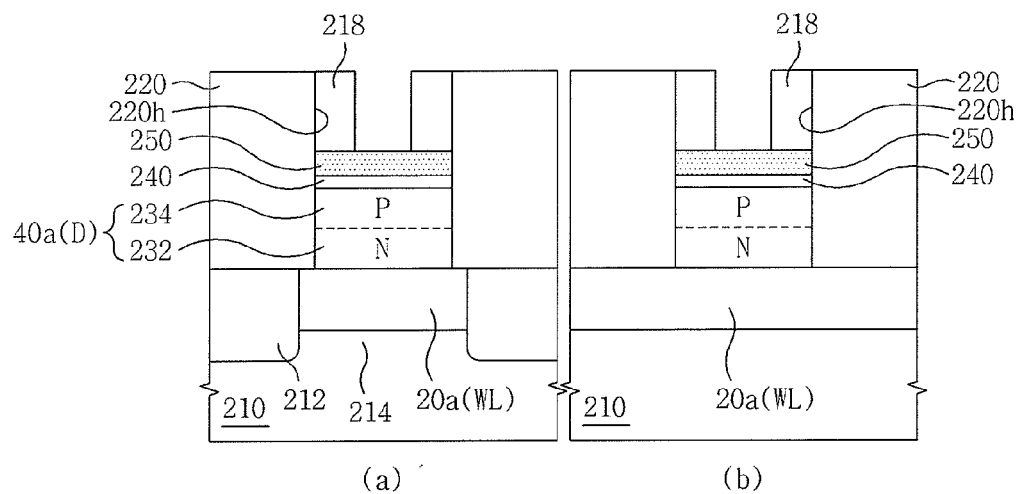

Referring to FIG. 7C, a spacer insulating pattern 218 may be formed in the first hole 220h along the sidewall of the first interlayer insulating layer 220. Portions of the spacer insulating layer 218r deposited on the top surface of the first interlayer insulating layer 220 and the bottom of the first hole 220h may be partially removed using, for example, an etchback process. Thus, the spacer insulating pattern 218 may be formed on the buffer electrode pattern 250 in alignment with an outer lateral surface of the buffer electrode pattern 250. In this case, since the buffer electrode pattern 250 is disposed on the silicide pattern 240, even if the spacer insulating layer 218r is over-etched, damage to the silicide pattern 240 may be prevented.

Figure 7D:
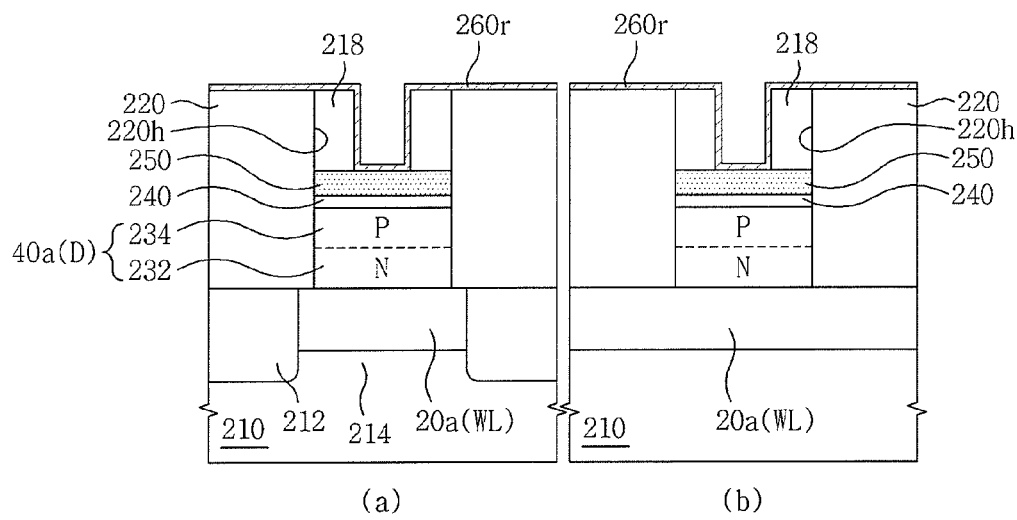

Referring to FIG. 7D, a lower electrode layer 260r may be formed to a uniform thickness within the spacer insulating pattern 218. The lower electrode layer 260r may be conformally deposited on at least a top surface of the buffer electrode pattern 250 and a sidewall of the spacer insulating pattern 218. Since the spacer insulating pattern 218 has a pipe-shaped 3-dimensional structure, the lower electrode layer 260r may have, for example, a cylindrical 3-dimensional structure. The lower electrode layer 260r may be obtained using, for example, a PVD process, a CVD process, an ALD process, or an e-beam evaporation process. The lower electrode layer 260r may include a high-resistivity material layer, such as, for example, a C layer, a CN layer, a TiN layer, a TiAlN layer, a TiSiN layer, a TiCN layer, a WN layer, a CoSiN layer, a WSiN layer, a TaN layer, a TaCN layer, or a TaSiN layer.

Figure 7E:
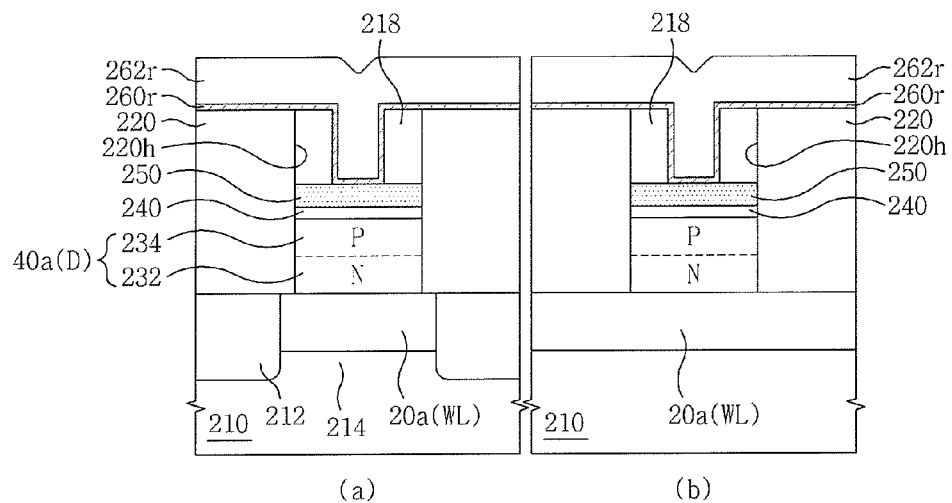

Referring to FIG. 7E, a core insulating layer 262r may be formed on the lower electrode layer 260r. The core insulating layer 262r may be deposited to such a sufficient thickness as to fill the inside of the cylindrical lower electrode layer 260r and cover the top surface of the first interlayer insulating layer 220. The core insulating layer 262r may be a material layer having an etch selectivity with respect to the first interlayer insulating layer 220. The core insulating layer 262r may include, for example, a SiO₂ layer, a SiN layer, a SiON layer, or a combination thereof.

Figure 7F:
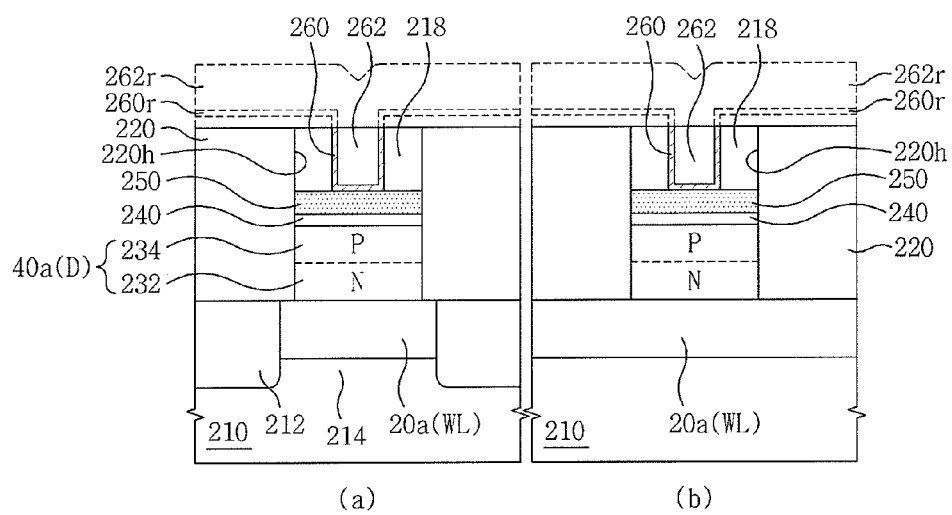

Referring to FIG. 7F, the lower electrode layer 260r and the core insulating layer 262r may be planarized using, for example, a CMP process or an etchback process. The CMP process may be performed until the top surface of the first interlayer insulating layer 220 is exposed. As a result, the thickness of the core insulating layer 262r may be reduced, thereby forming a lower electrode pattern 260 and a core insulating pattern 262. In this case, the lower electrode pattern 260 may have, for example, a cylindrical 3-dimensional structure or U-shaped longitudinal sectional structure, and surround a bottom surface and lateral surface of the core insulating pattern 262.

Figure 7G:
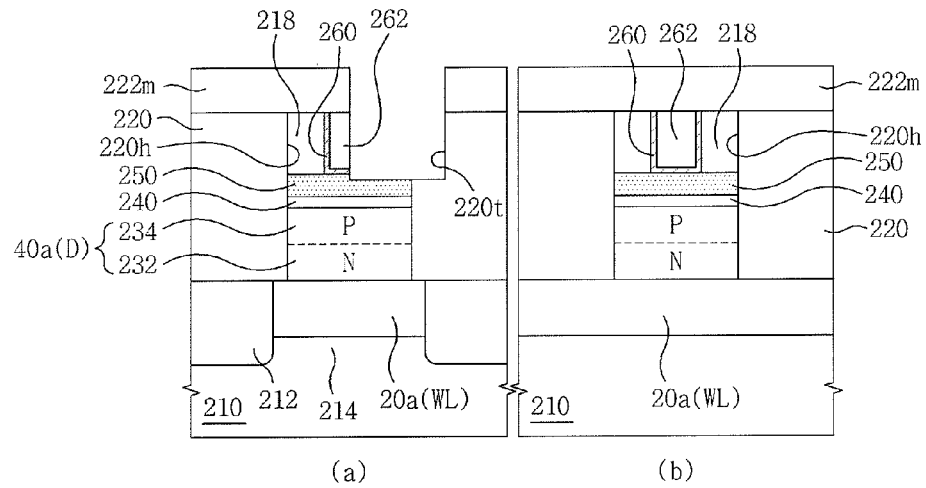

Referring to FIG. 7G, the lower electrode pattern 260 and the core insulating pattern 262 may be partially recessed using, for example, a trim process. During the recess process, the first insulating layer 220 and the spacer insulating pattern 218 may be partially removed. For example, a second mask pattern 222m may be formed on the substrate 210 to partially expose the core insulating pattern 262, the lower electrode pattern 260, the spacer insulating pattern 218, and the first interlayer insulating layer 220. The second mask pattern 222m may include, for example, a photoresist pattern or a hard mask pattern. The core insulating pattern 262, the lower electrode pattern 260, the spacer insulating pattern 218, and the first interlayer insulating layer 220 may be anisotropically etched using, for example, the second mask pattern 222m as an etch mask, thereby forming a trench 220t. The second mask pattern 222m may be removed. The trench 220t may horizontally extend to the spacer insulating pattern 218 and the first interlayer insulating layer 220, and vertically extend to an upper portion of the buffer electrode pattern 250. Thus, a longitudinal sectional structure of the lower electrode pattern 260 may be changed from a U-shaped structure to, for example, an L-shaped structure. In this case, since the buffer electrode pattern 250 is disposed under the lower electrode pattern 260, damage to the silicide pattern 240 by plasma during the etching of the lower electrode pattern 260 may be prevented.

Figure 7H:
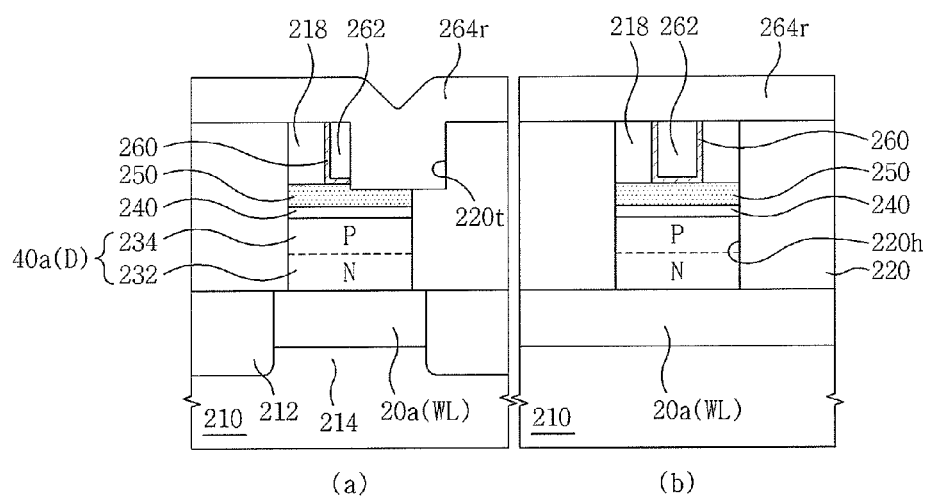

Referring to FIG. 7H, a trim insulating layer 264r may be formed on the buffer electrode pattern 250. The trim insulating layer 264r may be formed to such a sufficient thickness as to fill the trench 220t. The trim insulating layer 264r may be formed using a material layer having a higher electrical resistance than the lower electrode pattern 260. Also, the trim insulating layer 264r may be formed using a material layer having an etch selectivity with respect to the first interlayer insulating layer 220. The trim insulating layer 264r may include the same material layer as the core insulating pattern 262.

Figure 7I:
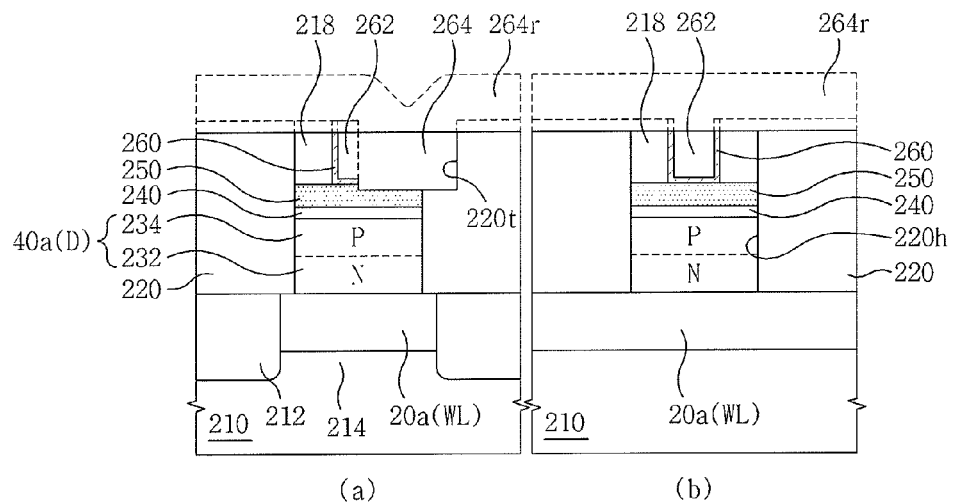

Referring to FIG. 7I, the trim insulating layer 264r may be planarized using, for example, a CMP process or an etchback process. The thickness of the trim insulating layer 264r may be reduced, thereby forming a trim insulating pattern 264. Although top surfaces of the core insulating pattern 262 and the trim insulating pattern 264 may become the same level through the planarization process, a bottom surface level of the trim insulating pattern 264 may be, for example, lower than a bottom surface level of the core insulating pattern 262 due to the trench 220t. The bottom surface level of the trim insulating pattern 264 may be, for example, lower than a top surface level of the buffer electrode pattern 250.

Figure 7J:
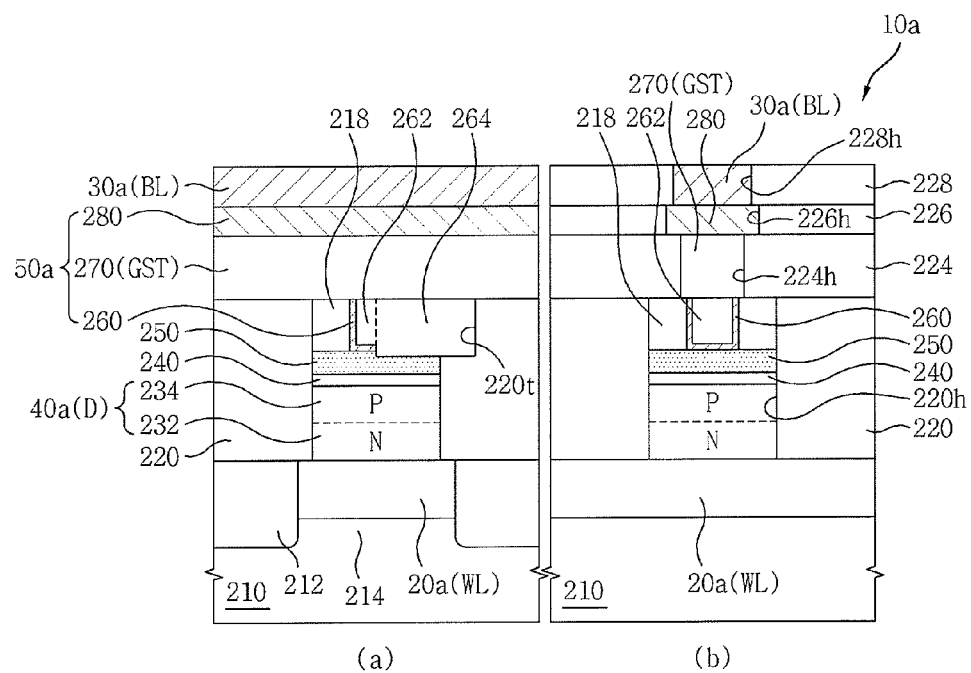

Referring to FIG. 7J, a second interlayer insulating layer 224 may be formed on the substrate 210, and a second hole 224h exposing the lower electrode pattern 260 may be formed in the second interlayer insulating layer 224 and extend in a second direction of the substrate 210. A variable resistive pattern 270 including, for example, a phase-change material layer may be formed in the second hole 224h to contact the lower electrode pattern 260. A third interlayer insulating layer 226 may be formed on the substrate 210, and a third hole 226h having, for example, a line shape may be formed in the third interlayer insulating layer 226 and extend in the second direction of the substrate 210. An upper electrode pattern 280 may be formed in the third hole 226h to contact the variable resistive pattern 270. A fourth interlayer insulating layer 228 may be formed on the substrate 210, and a fourth hole 228h having, for example, a line shape may be formed in the fourth interlayer insulating layer 228 and extend in the second direction of the substrate 210. An upper conductive line 30a may be formed in the fourth hole 228h to contact the upper electrode pattern 280.

FIGS. 8A through 8I are longitudinal sectional views illustrating a method of fabricating the semiconductor device of FIG. 4B, according to an exemplary embodiment of the inventive concept.

Figure 8A:
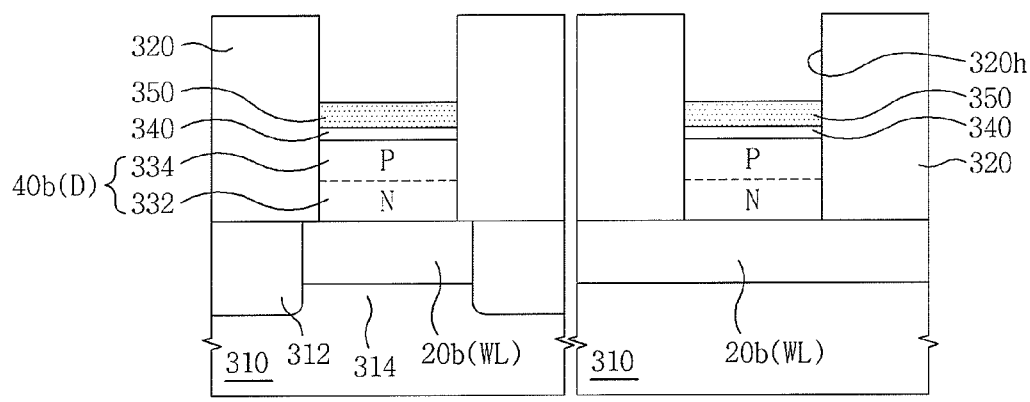

Referring to FIG. 8A, an isolation region 312 defining an active region 314 may be formed within a substrate 310, and impurity ions may be, for example, heavily implanted into the active region 314, thereby forming a lower conductive line 20b in the active region 314. A first interlayer insulating layer 320 may be formed in the substrate 310, and a first hole 320h having, for example, a circular shape may be formed in the first interlayer insulating layer 320 to expose the lower conductive line 20b. An n-type lower semiconductor pattern 332 may be, for example, epitaxially grown in the first hole 320h using the lower conductive line 20b as a seed layer, and a p-type upper semiconductor pattern 334 may be subsequently epitaxially grown in the first hole 320h using the lower semiconductor pattern 332 as a seed layer, thereby forming a vertical cell diode D electrically connected to the lower conductive line 20b. For example, a Co layer, a Ni layer, or a Ti layer may be deposited on the semiconductor pattern 334 and annealed, thereby forming a silicide pattern 340 serving as an ohmic contact layer. The silicide pattern 340 may be formed to a thickness between, for example, about 150 Å and about 250 Å. A buffer electrode pattern 350 may be formed to a thickness between, for example, about 350 Å and about 450 Å on the silicide pattern 340. The buffer electrode pattern 350 may be formed using, for example, a Ti layer, TiN layer, a Ta layer, a TaN layer, a W layer, a WN layer, a Ni layer, or a NiN layer.

Figure 8B:
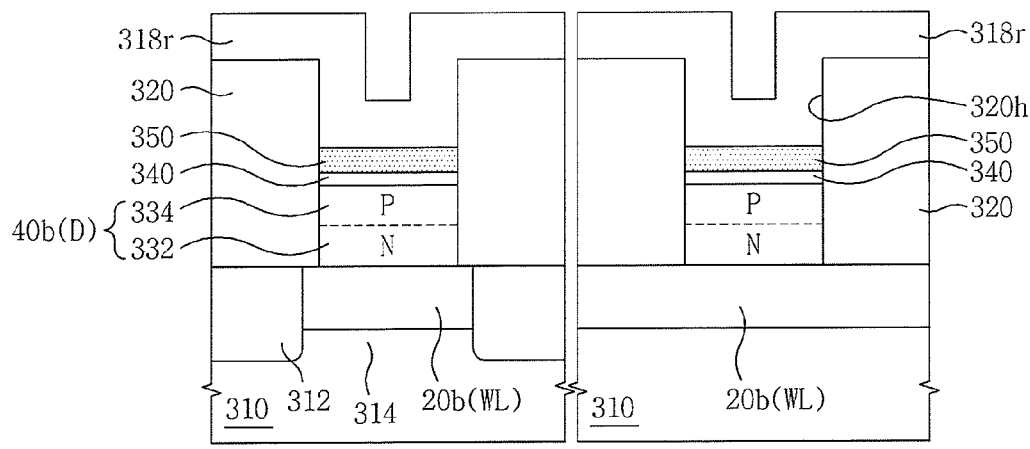

Referring to FIG. 8B, a spacer insulating layer 318r may be formed to a uniform thickness in the first hole 320h. The spacer insulating layer 318r may be conformally deposited on the buffer electrode pattern 350 and a sidewall and top surface of the first interlayer insulating layer 320. The spacer insulating layer 318r may be obtained using, for example, a deposition process, such as a CVD process. The spacer insulating layer 318r may include, for example, a SiO$_2$ layer, a SiN layer, a SiON layer, or a combination thereof.

Figure 8C:
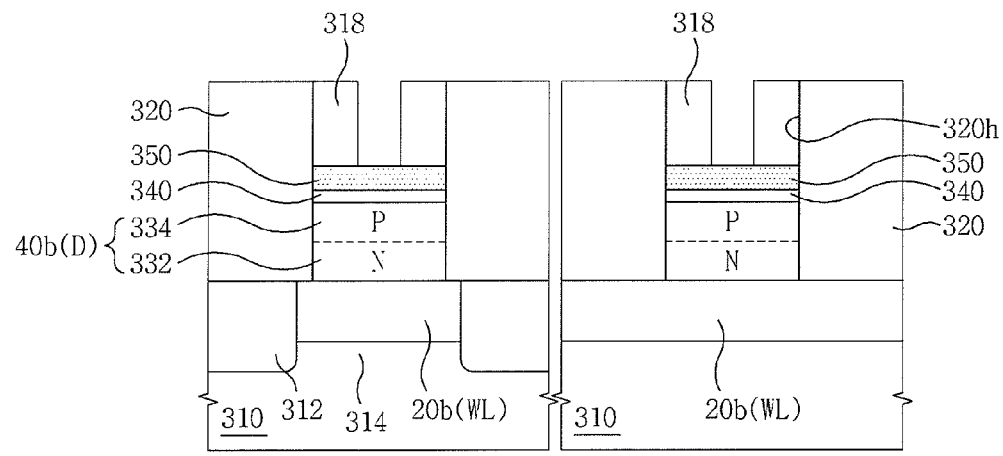

Referring to FIG. 8C, a spacer insulating pattern 318 may be formed in the first hole 320h along the sidewall of the first interlayer insulating layer 320. Portions of the spacer insulating layer 318r deposited on the top surface of the first interlayer insulating layer 320 and the bottom of the first hole 320h may be partially removed using, for example, an etchback process. Thus, the spacer insulating pattern 318 may be formed on the buffer electrode pattern 350 in self-alignment with an edge of the buffer electrode pattern 350. In this case, even if the spacer insulating layer 318r is over-etched, since the buffer electrode pattern 350 is disposed on the silicide pattern 340, damage to the silicide pattern 340 may be prevented.

Figure 8D:
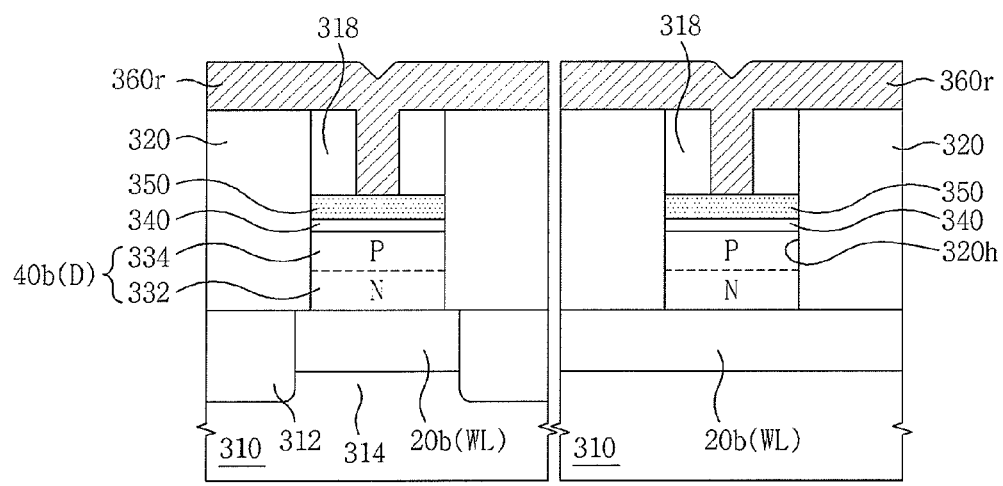

Referring to FIG. 8D, a lower electrode layer 360r may be formed to a uniform thickness within the spacer insulating pattern 318. The lower electrode layer 360r may be deposited to such a sufficient thickness as to fill the inside of the spacer insulating pattern 318. The lower electrode layer 360r may be formed using, for example, a PVD process (e.g., a sputtering process), a CVD process, an ALD process, or an e-beam evaporation process. The lower electrode layer 360r may include a high-resistivity material layer, such as, for example, a TiAlN layer, a TiSiN layer, or a TiCN layer.

Figure 8E:
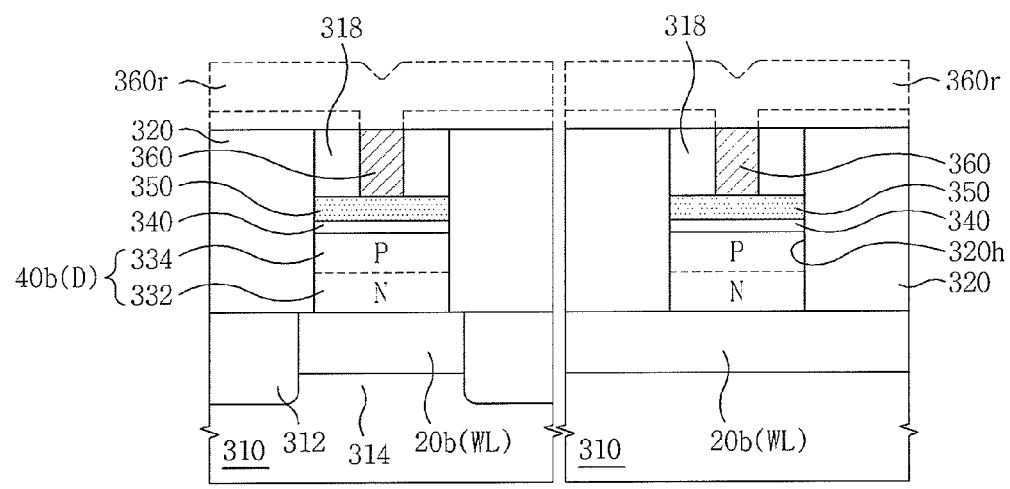

Referring to FIG. 8E, the lower electrode layer 360r may be planarized using, for example, a CMP process or an etchback process. The CMP process may be performed until the top surface of the first interlayer insulating layer 320 is exposed, thereby forming a lower electrode pattern 360. In this case, the lower electrode pattern 360 may have, for example, a pillar-type 3-dimensional structure.

Figure 8F:
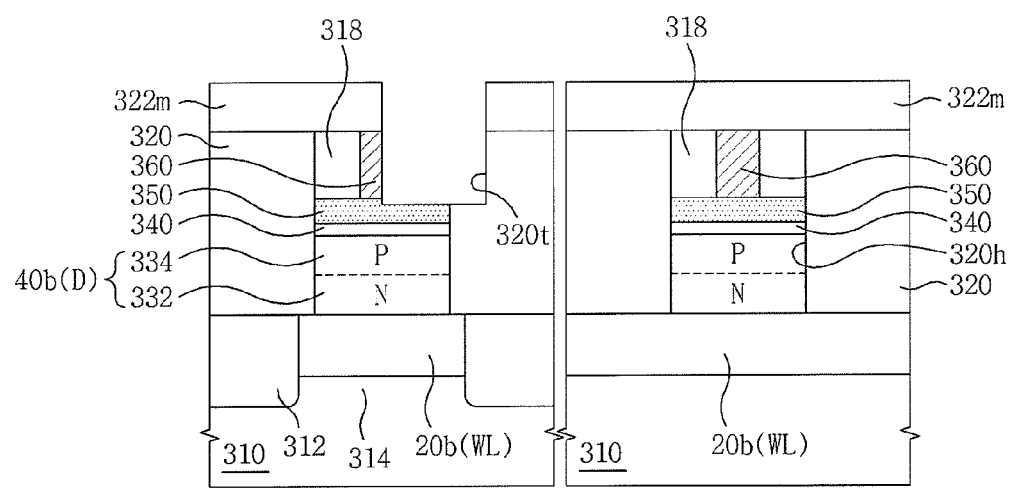

Referring to FIG. 8F, the lower electrode pattern 360 may be partially recessed using, for example, a trim process. During the recess process, the spacer insulating pattern 318 and the first interlayer insulating layer 320 may be partially removed. For instance, a second mask pattern 322m may be formed on the substrate 310 to partially expose the lower electrode pattern 360, the spacer insulating pattern 318, and the first interlayer insulating layer 320. The second mask pattern 322m may include, for example, a photoresist pattern or a hard mask pattern. The lower electrode pattern 360, the spacer insulating pattern 318, and the first interlayer insulating layer 320 may be etched using the second mask pattern 322m as an etch mask, thereby forming a trench 320t. The second mask pattern 322m may be removed. The trench 320t may horizontally extend to the spacer insulating pattern 318 and the first interlayer insulating layer 320 and vertically extend to an upper portion of the buffer electrode pattern 350. Thus, a longitudinal sectional structure of the lower electrode pattern 360 may be changed from a 3-dimensional structure with a pillar shape into, for example, a 3-dimensional structure with a half pillar shape. The half pillar shape may refer to a plane sectional shape obtained by vertically cutting a cylinder or polygonal pillar. In this case, since the buffer electrode pattern 350 is disposed under the lower electrode pattern 360, damage to the silicide pattern 340 due to plasma during the etching of the lower electrode pattern 360 may be prevented.

Figure 8G:
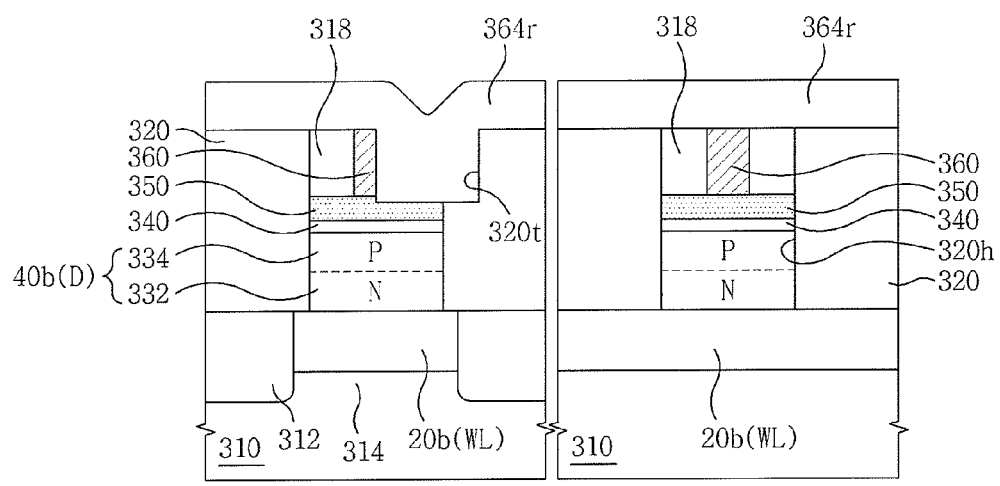

Referring to FIG. 8G, a trim insulating layer 364r may be formed on the buffer electrode pattern 350. The trim insulating layer 364r may be formed to such a sufficient thickness as to fill the trench 320t. The trim insulating layer 364r may be formed using a material having a higher electrical resistance than the lower electrode pattern 360. Also, the trim insulating layer 364r may be formed using a material layer having an etch selectivity with respect to the first interlayer insulating layer 320. The trim insulating layer 364r may include the same material layer as the spacer insulating pattern 318.

Figure 8H:
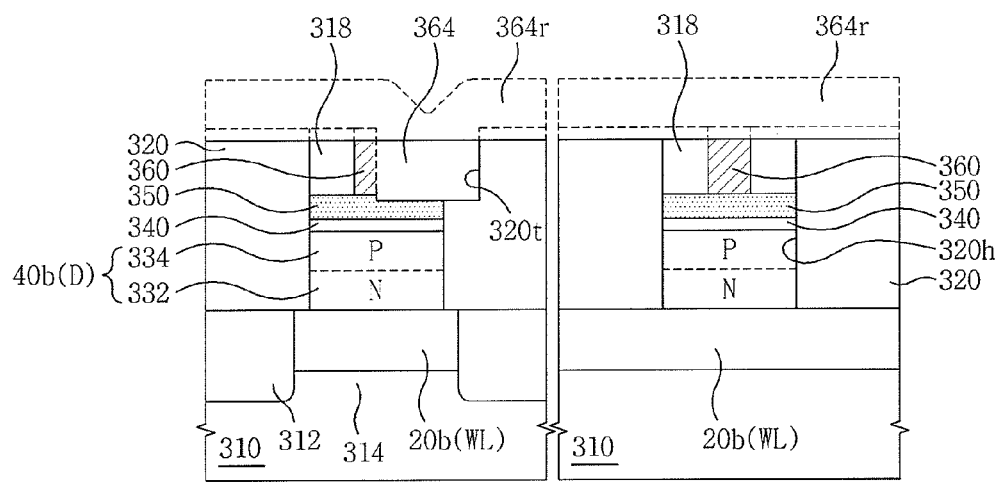

Referring to FIG. 8H, the trim insulating layer 364r may be planarized using, for example, a CMP process or an etchback process. The thickness of the trim insulating layer 364r may be reduced, thereby forming a trim insulating pattern 364. Due to the planarization process, a bottom surface level of the trim insulating pattern 364 may be, for example, lower than a bottom surface level of the lower electrode pattern 360.

Figure 8I:
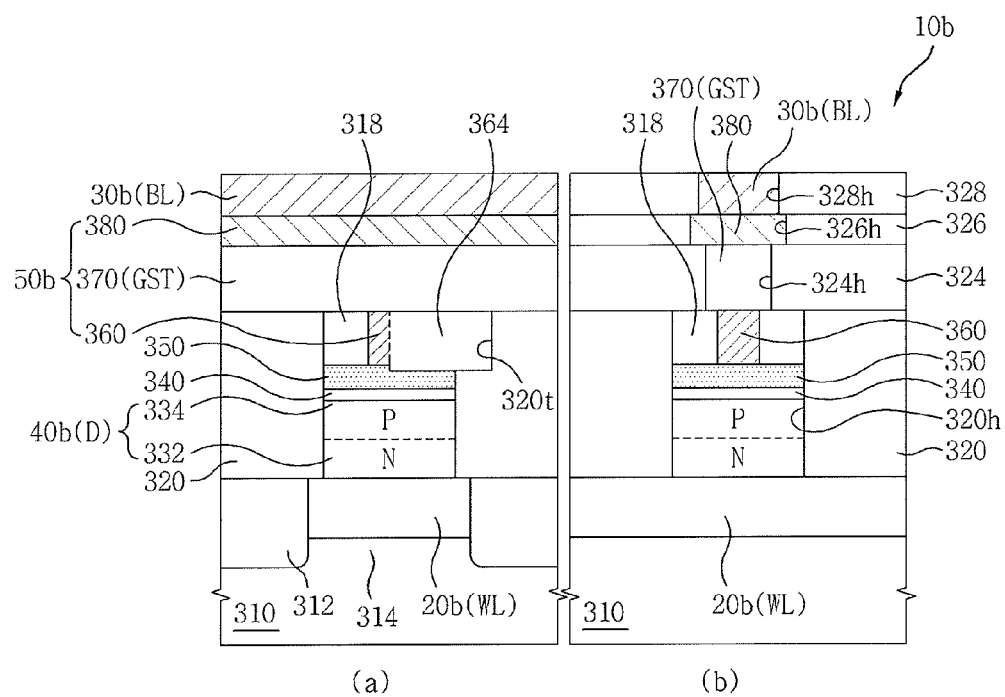

Referring to FIG. 8I, a second interlayer insulating layer 324 may be formed on the substrate 310, and a second hole 324h exposing the lower electrode pattern 360 may be formed in the second interlayer insulating layer 324 and extend in a second direction of the substrate 310. A variable resistive pattern 370 including, for example, a phase-change material layer may be formed in the second hole 324h to contact the lower electrode pattern 360. A third interlayer insulating layer 326 may be formed on the substrate 310, and a third hole 326h having, for example, a line shape may be formed in the third interlayer insulating layer 326 and extend in the second direction of the substrate 310. An upper electrode pattern 380 may be formed in the third hole 326h to contact the variable resistive pattern 370. A fourth interlayer insulating layer 328 may be formed on the substrate 310, and a fourth hole 328h having, for example, a line shape may be formed in the fourth interlayer insulating layer 328 and extend in the second direction of the substrate 310. An upper conductive line 30b may be formed in the fourth hole 328h to contact the upper electrode pattern 380.

FIGS. 9A through 9I are longitudinal sectional views illustrating a method of fabricating the semiconductor device of FIG. 5B, according to an exemplary embodiment of the inventive concept.

Figure 9A:
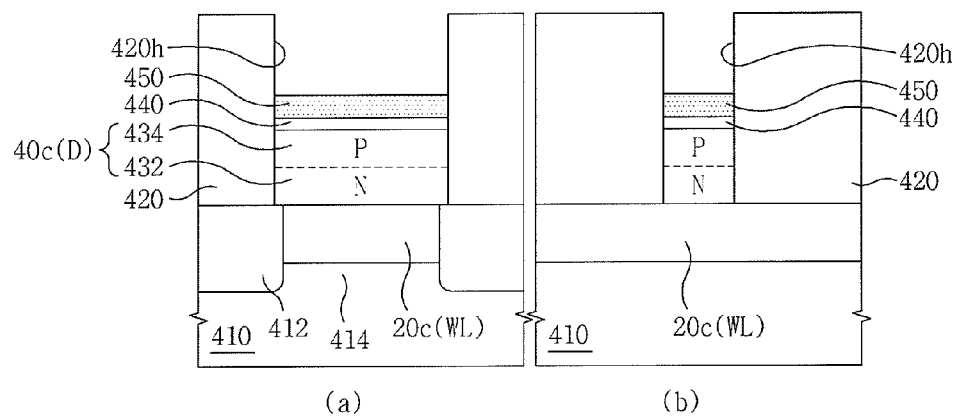

Referring to FIG. 9A, an isolation region 412 defining an active region 414 may be formed within a substrate 410, and impurity ions may be, for example, heavily implanted into the active region 414, thereby forming a lower conductive line 20c in the active region 414. A first interlayer insulating layer 420 may be formed on the substrate 410, and a first hole 420h having, for example, an elliptical shape may be formed in the first interlayer insulating layer 420 to expose the lower conductive line 20c. An n-type lower semiconductor pattern 432 may be, for example, epitaxially grown in the first hole 420h using the lower conductive line 20c as a seed layer, and a p-type upper semiconductor pattern 434 may be subsequently epitaxially grown in the first hole 420h using the lower semiconductor pattern 432 as a seed layer, thereby forming a vertical cell diode D electrically connected to the lower conductive line 20c. A metal layer, such as, for example, a Co layer, a Ni layer, or a Ti layer, may be deposited on the upper semiconductor pattern 434 and annealed, thereby forming a silicide pattern 440 serving as an ohmic contact layer. The silicide pattern 440 may be formed to a thickness between, for example, about 150 Å and about 250 Å. A buffer electrode pattern 450 may be formed on the silicide pattern 440 to a thickness between, for example, about 350 Å and about 450 Å. The buffer electrode pattern 450 may be formed using, for example, a Ti layer, a TiN layer, a Ta layer, a TaN layer, a W layer, a WN layer, a Ni layer, or a NiN layer.

Figure 9B:
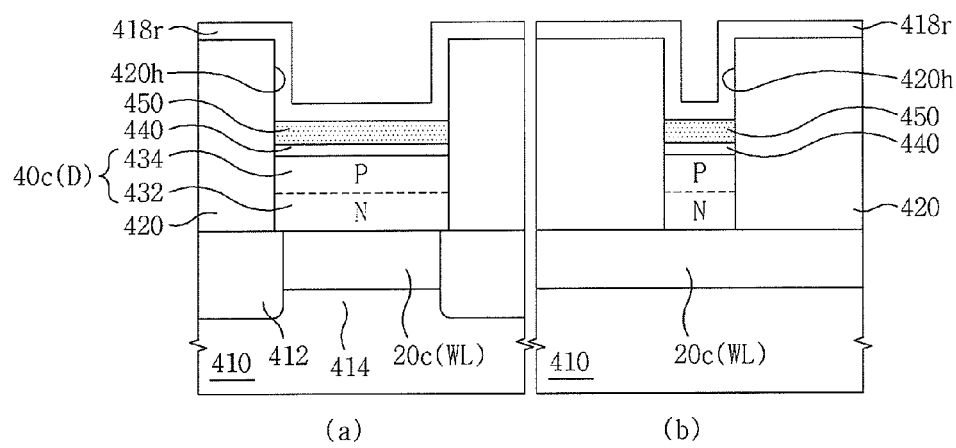

Referring to FIG. 9B, a spacer insulating layer 418r may be formed to a uniform thickness in the first hole 420h. The spacer insulating layer 418r may be conformally deposited on the buffer electrode pattern 450 and a sidewall and top surface of the first interlayer insulating layer 420. The spacer insulating layer 418r may be formed using, for example, a deposition process, such as a CVD process. The spacer insulating layer 418r may be formed using, for example, a SiO2 layer, a SiN layer, a SiON layer, or a combination thereof. In this case, since the first hole 420h has, for example, an elliptical shape, when the spacer insulating layer 418r is deposited in the first hole 420h, a void, such as a slit, may be formed.

Figure 9C:
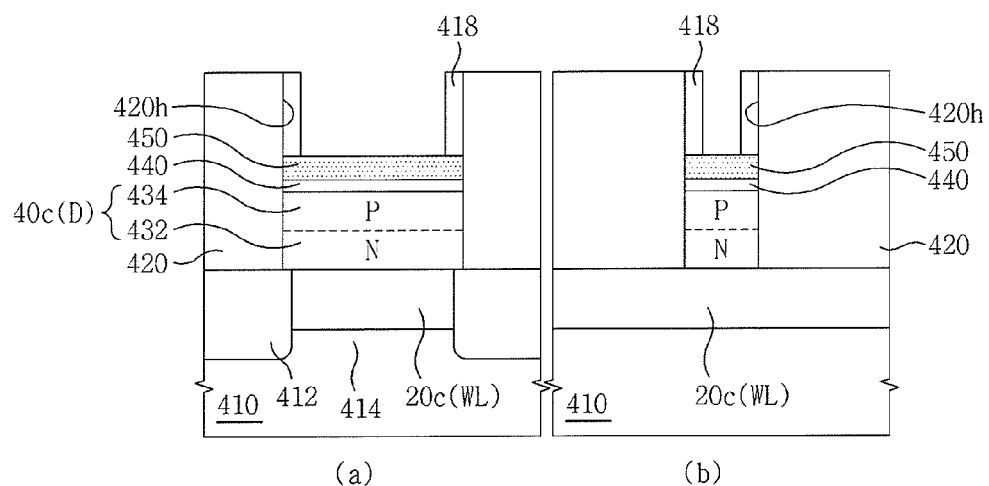

Referring to FIG. 9C, a spacer insulating pattern 418 may be formed in the first hole 420h along the sidewall of the first interlayer insulating layer 420. Portions of the spacer insulating layer 418r deposited on the top surface of the first interlayer insulating layer 420 and on the bottom of the first hole 420h may be partially removed using, for example, an etchback process. Thus, the spacer insulating pattern 418 may be formed on the buffer electrode pattern 450 in alignment with an outer lateral surface of the buffer electrode pattern 450. In this case, since the buffer electrode pattern 450 is disposed on the silicide pattern 440, even if overetching occurs, damage to the silicide pattern 440 may be prevented.

Figure 9D:
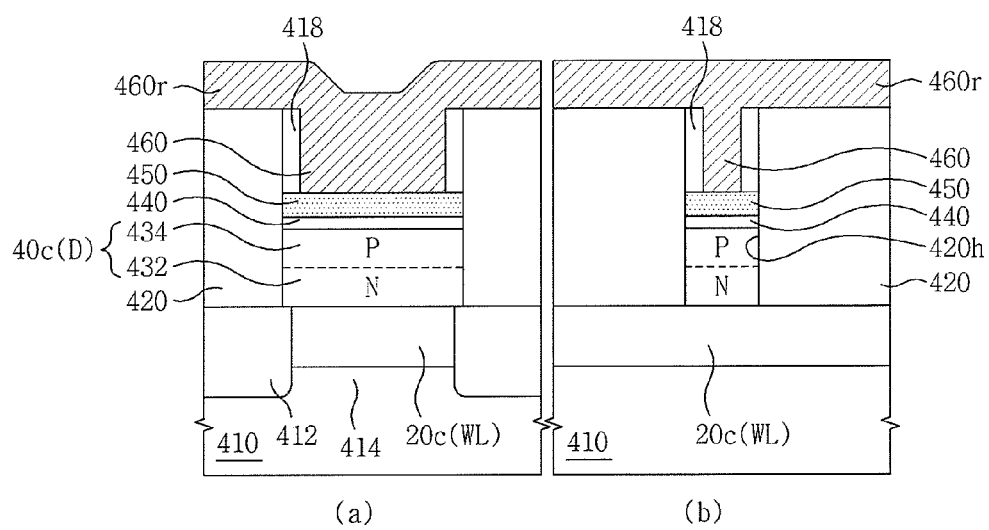

Referring to FIG. 9D, a lower electrode layer 460r may be formed to a uniform thickness within the spacer insulating pattern 418. The lower electrode layer 460r may be deposited to such a sufficient thickness as to fill the inside of the spacer insulating pattern 418. The lower electrode layer 460r may be formed using, for example, a PVD process, a CVD process, an ALD process, or an e-beam evaporation process. The lower electrode layer 460r may include a high-resistivity material layer, such as, for example, a C layer, a CN layer, a TiN layer, a TiAlN layer, a TiSiN layer, a TiCN layer, a WN layer, a CoSiN layer, a WSiN layer, a TaN layer, a TaCN layer, or a TaSiN layer.

Figure 9E:
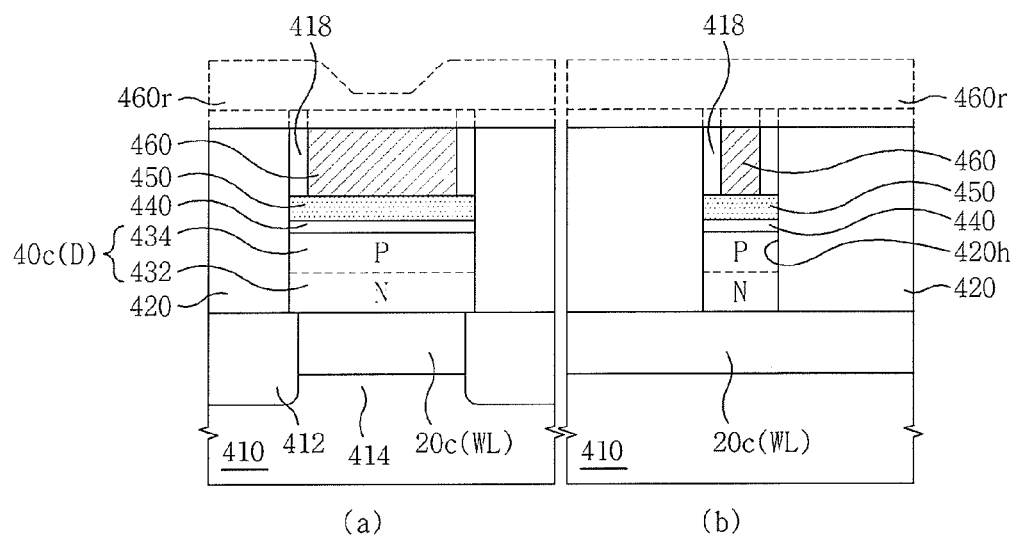

Referring to FIG. 9E, the lower electrode layer 460r may be planarized using, for example, a CMP process or an etchback process. The CMP process may be performed until the top surface of the first interlayer insulating layer 420 is exposed, thereby forming a lower electrode pattern 460. In this case, the lower electrode pattern 460 may have, for example, a line-type 3-dimensional structure.

Figure 9F:
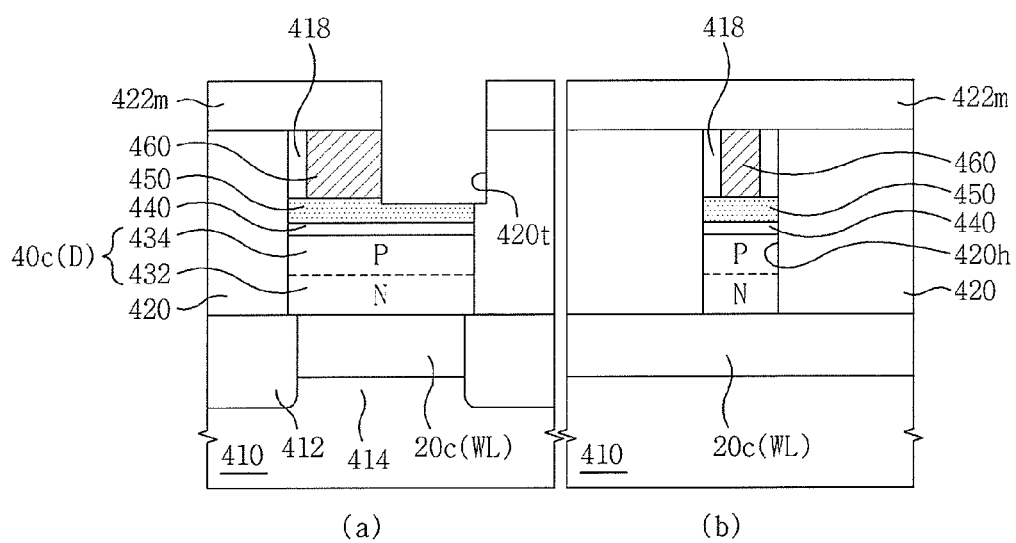

Referring to FIG. 9F, the lower electrode pattern 460 may be partially recessed using, for example, a trim process. During the recess process, the spacer insulating pattern 418 and the first interlayer insulating layer 420 may be partially removed. For instance, a second mask pattern 422m may be formed on the substrate 410 to partially expose the lower electrode pattern 460, the spacer insulating pattern 418, and the first interlayer insulating layer 420. The second mask pattern 422m may include, for example, a photoresist pattern or a hard mask pattern. The lower electrode pattern 460, the spacer insulating pattern 418, and the first interlayer insulating layer 420 may be etched using, for example, the second mask pattern 422m as an etch mask, thereby forming a trench 420t. The second mask pattern 422m may be removed. The trench 420t may horizontally extend to the spacer insulating pattern 418 and the first interlayer insulating layer 420 and vertically extend to an upper portion of the buffer electrode pattern 450. Thus, a longitudinal sectional structure of the lower electrode pattern 460 may be changed from a 3 dimensional structure with a line or dash shape into, for example, a 3-dimensional structure with a half-line or dash shape. In this case, since the buffer electrode pattern 450 is disposed under the lower electrode pattern 460, damage to the silicide pattern 440 due to plasma during the etching of the lower electrode pattern 460 may be prevented.

Figure 9G:
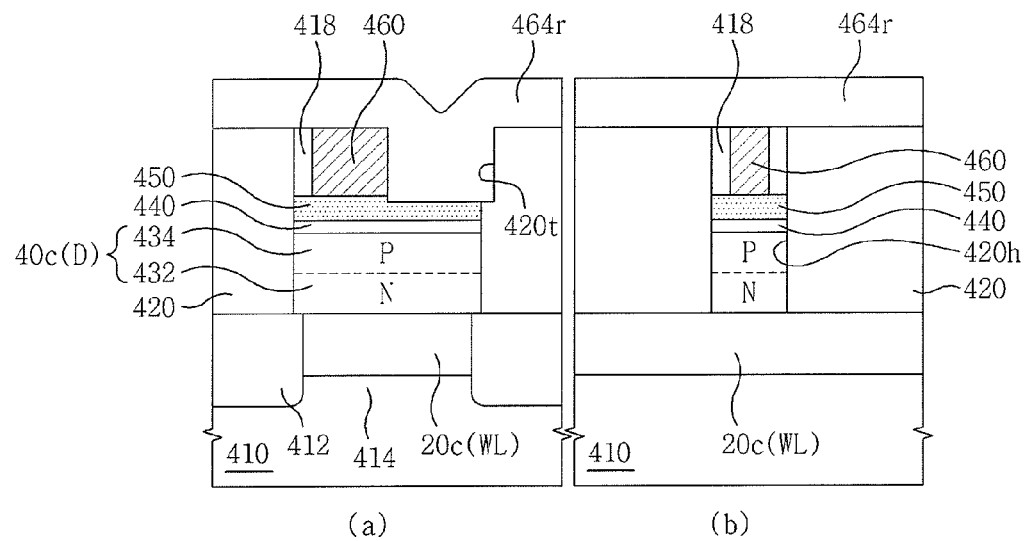

Referring to FIG. 9G, a trim insulating layer 464r may be formed on the buffer electrode pattern 450. The trim insulating layer 464r may be deposited to such a sufficient thickness as to fill the trench 420t. The trim insulating layer 464r may be formed using a material layer having a higher electrical resistance than the lower electrode pattern 460. Also, the trim insulating layer 464r may be formed using a material layer having an etch selectivity with respect to the first interlayer insulating layer 420. The trim insulating layer 464r may include the same material layer as the spacer insulating pattern 418.

Figure 9H:
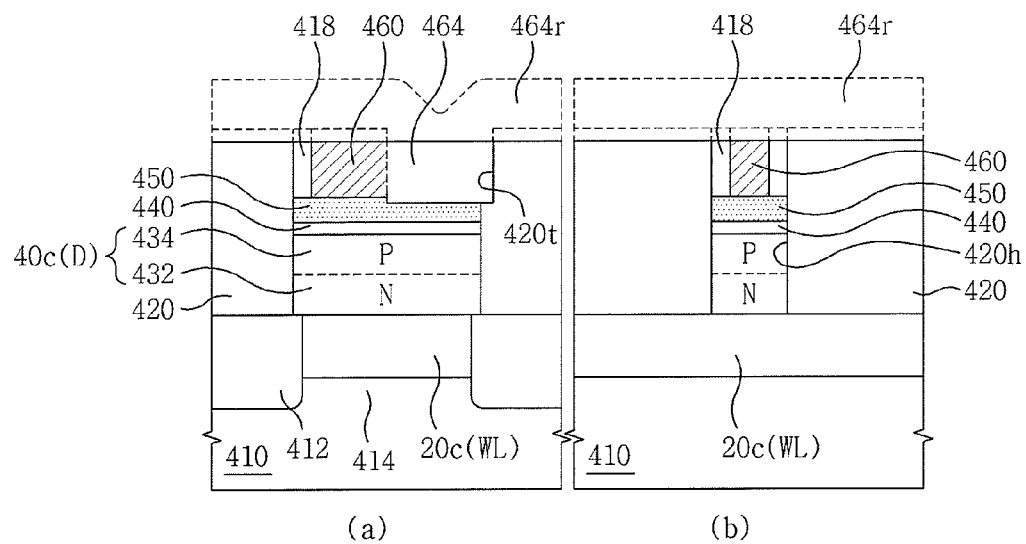

Referring to FIG. 9H, the trim insulating layer 464r may be planarized using, for example, a CMP process or an etchback process. By reducing the thickness of the trim insulating layer 464r, a trim insulating pattern 464 may be formed. Due to the planarization process, a bottom surface level of the trim insulating pattern 464 may be, for example, lower than a bottom surface level of the lower electrode pattern 460.

Figure 9I:
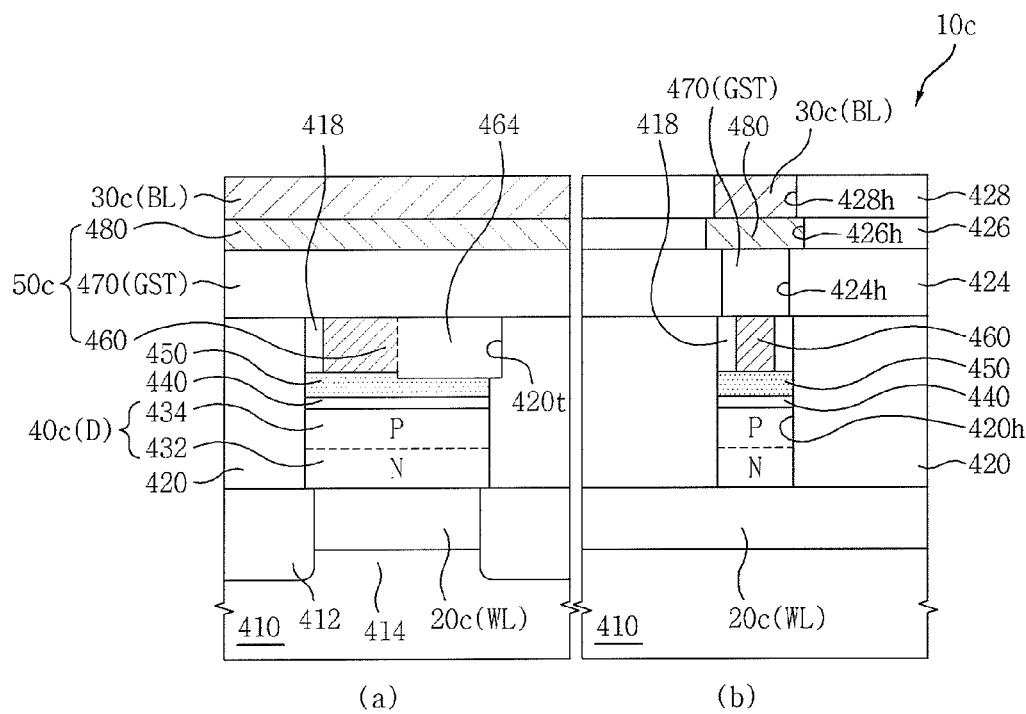

Referring to FIG. 9I, a second interlayer insulating layer 424 may be formed on the substrate 410, and a second hole 424h exposing the lower electrode pattern 460 may be formed in the second interlayer insulating layer 424 and extend in a second direction of the substrate 410. A variable resistive pattern 470 including, for example, a phase-change material layer may be formed in the second hole 424h to contact the lower electrode pattern 460. A third interlayer insulating layer 426 may be formed on the substrate 410, and a third hole 426h having, for example, a line shape may be formed in the third interlayer insulating layer 426 and extend in the second direction of the substrate 410. An upper electrode pattern 480 may be formed in the third hole 426h to contact the variable resistive pattern 470. A fourth interlayer insulating layer 428 may be formed on the substrate 410, and a fourth hole 428h having, for example, a line shape may be formed in the fourth interlayer insulating layer 428 and extend in the second direction of the substrate 410. An upper conductive line 30c may be formed in the fourth hole 428h to contact the upper electrode pattern 480.

Application Example

Figure 10:
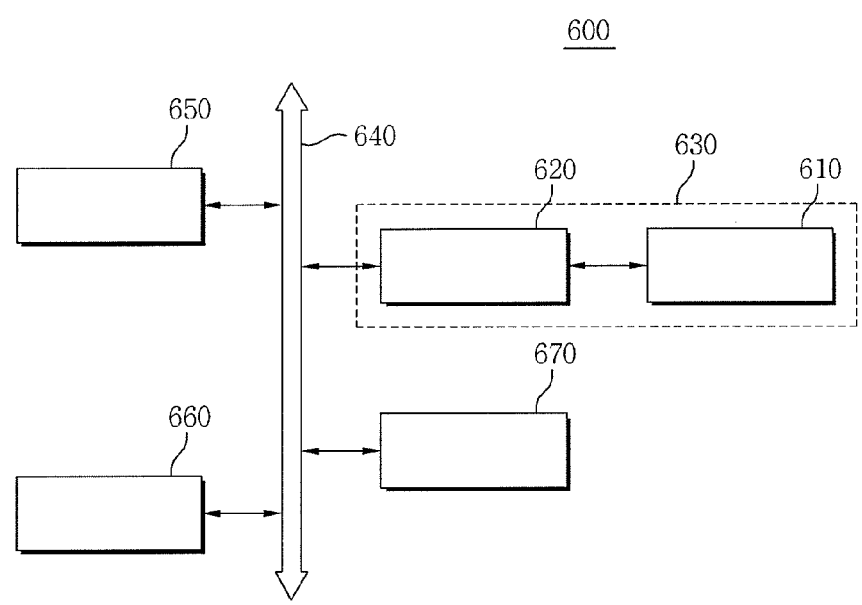
FIG. 10 is a block diagram of a memory system including various semiconductor devices according to an exemplary embodiment of the inventive concept.

FIG. 10 is a block diagram of a memory system including a semiconductor device according to an exemplary embodiment of the inventive concept.

Referring to FIG. 10, a memory system 600 according to an exemplary embodiment of the inventive concept may include, for example, a semiconductor memory device 630, a central processing unit (CPU) 650, a user interface 660, and a power supply device 670. The semiconductor memory device 630 may include, for example, a variable resistive memory device 610 and a memory controller 620. The CPU 650, the user interface 660, and the power supply device 670 may be electrically connected to a system bus 640. Each of the variable resistive memory device 610 and the memory controller 620 may include, for example, at least one (e.g., a PRAM) of the semiconductor devices 10, 10a, 10b, and 10c according to the embodiments of the inventive concept. Data received through the user interface 660 or processed by the CPU 650 may be stored in the variable resistive memory device 610 through the memory controller 620. The variable resistive memory device 610 may include, for example, a semiconductor disc device (SDD). In this case, the write speed of the memory system 600 may be markedly increased. Although not shown in FIG. 10, the memory system 600 according to an exemplary embodiment of the inventive concept may further include, for example, an application chipset, a camera image processor (CIS), or a mobile dynamic random access memory (mobile DRAM). Also, the memory system 600 may be applied to, for example, personal digital assistants (PDAs), portable computers, web tablets, wireless phones, mobile phones, digital music players, memory cards, or all devices capable of transmitting and/or receiving data in wireless environments. Furthermore, the variable resistive memory device 610 or the memory system 600 according to an exemplary embodiment of the inventive concept may be mounted in packages having various shapes. For example, the variable resistive memory device 610 or the memory system 600 according to an exemplary embodiment of the inventive concept may be mounted in packages using various methods, such as a package on package (PoP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat pack (MQFP) technique, a thin quad flatpack (TQFP) technique, a small outline (SOIC) technique, a shrink small outline package (SSOP) technique, a thin small outline (TSOP) technique, a thin quad flatpack (TQFP) technique, a system in package (SIP) technique, a multichip package (MCP) technique, a wafer-level fabricated package (WFP) technique, or a wafer-level processed stack package (WSP) technique.

According to exemplary embodiments of the inventive concept, at least the following effects set forth below can be expected.

First, a lower electrode pattern can be formed using, for example, TiAlN, TiSiN, or TiCN, thereby increasing resistivity and reducing a reset current.

Second, a buffer electrode pattern including, for example, Ti or TiN can be interposed between an ohmic contact layer and the lower electrode pattern so that contact resistance between the ohmic contact layer and the lower electrode pattern can be reduced.

Third, since the height of the lower electrode pattern can be reduced to the thickness of the buffer electrode pattern, and the length of the lower electrode pattern can be shortened, dynamic resistance of the lower electrode pattern can be reduced.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
   a switching device disposed on a substrate;
   a buffer electrode pattern disposed on the switching device, the buffer electrode pattern including a first region having a first vertical thickness, and a second region having a second vertical thickness smaller than the first vertical thickness;
   a lower electrode pattern disposed on the first region of the buffer electrode pattern;
   a trim insulating pattern disposed on the second region of the buffer electrode pattern, wherein a bottom surface of the trim insulating pattern is lower than a bottom surface of the lower electrode pattern; and a variable resistive pattern disposed on the lower electrode pattern.

2. The device of claim 1, wherein the lower electrode pattern comprises:
   a first pattern contacting the buffer electrode pattern and extending in a direction parallel to the substrate; and
   a second pattern contacting the variable resistive pattern and extending in a direction vertical to the substrate.

3. The device of claim 2, further comprising a core insulating pattern disposed on the first pattern,
   wherein the lower electrode pattern and the core insulating pattern each overlap the first region of the buffer electrode pattern.

4. The device of claim 3, further comprising a spacer insulating pattern disposed on the buffer electrode pattern and surrounding a lateral surface of the second pattern of the lower electrode pattern.

5. The device of claim 1, wherein the trim insulating pattern extends downwardly into a recess located in the buffer electrode pattern in the second region of the buffer electrode pattern.

6. The device of claim 5, wherein the buffer electrode pattern has a stepwise structure.

7. The device of claim 1, further comprising:
   a lower conductive line disposed below the switching device and extending in a first direction of the substrate;
   an upper electrode pattern disposed on an upper surface of the variable resistive pattern; and
   an upper conductive line disposed on the upper electrode pattern and extending in a second direction of the substrate and intersects the lower conductive line, wherein the lower electrode pattern, the variable resistive pattern and the upper electrode pattern together constitute a variable resistive device, and wherein the variable resistive device is connected to lower conductive line through the switching device and connected to the upper conductive line.

8. The device of claim 7, wherein the upper electrode pattern and the lower electrode pattern include a same material as each other.

9. The device of claim 7, wherein the upper electrode pattern is disposed in direct physical contact with the upper surface of the variable resistive pattern and in direct physical contact with a lower surface of the upper conductive line.

10. A semiconductor device comprising:
    a switching device disposed on a substrate;
    a buffer electrode pattern disposed on the switching device, the buffer electrode pattern including a first region having a first vertical thickness, and a second region having a second vertical thickness smaller than the first vertical thickness;
    a lower electrode pattern disposed on the first region of the buffer electrode pattern, the lower electrode pattern comprising a first pattern contacting the buffer electrode pattern and extending in a direction parallel to the substrate and a second pattern contacting the variable resistive pattern and extending in a direction vertical to the substrate;
    a trim insulating pattern disposed on the second region of the buffer electrode pattern;
    a core insulating pattern disposed on the first pattern, wherein the lower electrode pattern and the core insulating pattern each overlap the first region of the buffer electrode pattern;
    a spacer insulating pattern disposed on the buffer electrode pattern and surrounding a lateral surface of the second pattern of the lower electrode pattern; and
    a variable resistive pattern disposed on the lower electrode pattern.

11. The device of claim 10, wherein each of a lower region of the lower electrode pattern in contact with the buffer electrode pattern and an upper region of the lower electrode pattern in contact with the variable resistive pattern has a semicircular plane sectional shape so that the lower electrode pattern has a half pillar shape.

12. The device of claim 11, further comprising a spacer insulating pattern disposed on the buffer electrode pattern and surrounding a lateral surface of the lower electrode pattern,
    wherein the lower electrode pattern and the spacer insulating pattern each overlap the first region of the buffer electrode pattern.

13. The device of claim 10, wherein each of a lower region of the lower electrode pattern in contact with the buffer electrode pattern and an upper region of the lower electrode pattern in contact with the variable resistive pattern has a dash-type plane sectional shape.

14. The device of claim 10, further comprising an ohmic contact layer disposed between the switching device and the buffer electrode pattern.

15. The device of claim 14, wherein the buffer electrode pattern includes a metal compound containing a first metal, and the ohmic contact layer includes a metal silicide containing a second metal different from the first metal.

16. The device of claim 15, wherein the lower electrode pattern includes any one selected from the group consisting of a metal-silicon-nitride, a metal-aluminum-nitride, and a metal-carbon-nitride.

17. A semiconductor device comprising:
    a switching device disposed on a substrate;
    a buffer electrode pattern disposed on the switching device, the buffer electrode pattern including a first region and a second region;
    a lower electrode pattern disposed on the first region of the buffer electrode pattern;
    a trim insulating pattern disposed on the second region of the buffer electrode pattern; and
    a variable resistive pattern disposed on the lower electrode pattern,
    wherein a sidewall of the switching device and a sidewall of the buffer electrode pattern are vertically aligned.

18. The device of claim 17, wherein a sidewall of the lower electrode pattern and the sidewall of the buffer electrode pattern are vertically aligned.

19. The device of claim 17, further comprising:
    a silicide pattern between the switching device and the buffer electrode pattern.

20. The device of claim 19, wherein a sidewall of the silicide pattern and the sidewall of the buffer electrode pattern are vertically aligned.

* * * * *